United States Patent
Melanson

(10) Patent No.: US 7,863,828 B2
(45) Date of Patent: Jan. 4, 2011

(54) POWER SUPPLY DC VOLTAGE OFFSET DETECTOR

(75) Inventor: John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 308 days.

(21) Appl. No.: 11/967,277

(22) Filed: Dec. 31, 2007

(65) Prior Publication Data

US 2008/0272757 A1 Nov. 6, 2008

Related U.S. Application Data

(60) Provisional application No. 60/915,547, filed on May 2, 2007.

(51) Int. Cl.
*H05B 41/16* (2006.01)
(52) U.S. Cl. .......... 315/247; 315/307; 363/89
(58) Field of Classification Search ............ 363/15–17, 363/21.01, 21.13, 21.15, 21.06, 21.12, 25, 363/26, 89, 127, 81, 97; 323/224, 282–286, 323/222, 268, 271, 287; 315/194, 119, 247
See application file for complete search history.

(56) References Cited

U.S. PATENT DOCUMENTS

| | | |
|---|---|---|
| 3,316,495 A | 4/1967 | Sherer |
| 3,423,689 A | 1/1969 | Miller et al. |
| 3,586,988 A | 6/1971 | Weekes |
| 3,725,804 A | 4/1973 | Langan |
| 3,790,878 A | 2/1974 | Brokaw |
| 3,881,167 A | 4/1975 | Pelton et al. |
| 4,075,701 A | 2/1978 | Hofmann |
| 4,334,250 A | 6/1982 | Theus |

(Continued)

FOREIGN PATENT DOCUMENTS

EP 0585789 A1 3/1994

(Continued)

OTHER PUBLICATIONS

Freescale Semiconductor, Inc., Dimmable Light Ballast with Power Factor Correction, Design Reference Manual, DRM067, Rev. 1, Dec. 2005.

(Continued)

*Primary Examiner*—Rajnikant B Patel
(74) *Attorney, Agent, or Firm*—Hamilton & Terrile, LLP; Kent B. Chambers

(57) ABSTRACT

A power supply output voltage direct current (DC) offset detector determines a DC offset in a power supply output voltage signal, and the output voltage signal has a DC component and an alternating current (AC) "ripple" component. Once during each period of the ripple, the DC offset detector determines the DC offset from an output voltage signal using a comparison between the output voltage signal and a reference voltage. In at least one embodiment, from the comparison and during a period of the ripple, the DC offset detector determines an 'above' duration for which the ripple is above the reference voltage, determines a 'below' duration for which the ripple is below the reference voltage, or both to determine the DC offset of the power supply output voltage signal. The DC offset detector uses the above and/or below duration(s) to determine the DC offset of the output voltage signal.

20 Claims, 12 Drawing Sheets

U.S. PATENT DOCUMENTS

| | | |
|---|---|---|
| 4,414,493 A | 11/1983 | Henrich |
| 4,476,706 A | 10/1984 | Hadden et al. |
| 4,677,366 A | 6/1987 | Wilkinson et al. |
| 4,683,529 A | 7/1987 | Bucher |
| 4,700,188 A | 10/1987 | James |
| 4,737,658 A | 4/1988 | Kronmuller et al. |
| 4,797,633 A | 1/1989 | Humphrey |
| 4,940,929 A | 7/1990 | Williams |
| 4,973,919 A | 11/1990 | Allfather |
| 4,979,087 A | 12/1990 | Sellwood et al. |
| 4,992,919 A | 2/1991 | Lee et al. |
| 4,994,952 A | 2/1991 | Silva et al. |
| 5,206,540 A | 4/1993 | de Sa e Silva et al. |
| 5,278,490 A | 1/1994 | Smedley |
| 5,323,157 A | 6/1994 | Ledzius et al. |
| 5,359,180 A | 10/1994 | Park et al. |
| 5,383,109 A | 1/1995 | Maksimovic et al. |
| 5,477,481 A | 12/1995 | Kerth |
| 5,481,178 A | 1/1996 | Wilcox et al. |
| 5,565,761 A | 10/1996 | Hwang |
| 5,638,265 A | 6/1997 | Gabor |
| 5,691,890 A | 11/1997 | Hyde |
| 5,747,977 A | 5/1998 | Hwang |
| 5,764,039 A | 6/1998 | Choi et al. |
| 5,781,040 A | 7/1998 | Myers |
| 5,783,909 A | 7/1998 | Hochstein |
| 5,900,683 A | 5/1999 | Rinehart et al. |
| 5,929,400 A | 7/1999 | Colby et al. |
| 5,946,202 A | 8/1999 | Balogh |
| 5,952,849 A | 9/1999 | Haigh et al. |
| 5,960,207 A | 9/1999 | Brown |
| 5,963,086 A | 10/1999 | Hall |
| 5,966,297 A | 10/1999 | Minegishi |
| 5,994,885 A | 11/1999 | Wilcox et al. |
| 6,016,038 A | 1/2000 | Mueller et al. |
| 6,043,633 A | 3/2000 | Lev et al. |
| 6,072,969 A | 6/2000 | Yokomori et al. |
| 6,083,276 A | 7/2000 | Davidson et al. |
| 6,084,450 A | 7/2000 | Smith et al. |
| 6,150,774 A | 11/2000 | Mueller et al. |
| 6,211,626 B1 | 4/2001 | Lys et al. |
| 6,211,627 B1 | 4/2001 | Callahan |
| 6,229,271 B1 | 5/2001 | Liu |
| 6,246,183 B1 | 6/2001 | Buonavita |
| 6,259,614 B1 | 7/2001 | Ribarich et al. |
| 6,300,723 B1 * | 10/2001 | Wang et al. .................. 315/247 |
| 6,304,066 B1 | 10/2001 | Wilcox et al. |
| 6,304,473 B1 | 10/2001 | Telefus et al. |
| 6,344,811 B1 | 2/2002 | Melanson |
| 6,385,063 B1 | 5/2002 | Sadek et al. |
| 6,407,691 B1 | 6/2002 | Yu |
| 6,441,558 B1 | 8/2002 | Muthu et al. |
| 6,445,600 B2 | 9/2002 | Ben-Yaakov |
| 6,452,521 B1 | 9/2002 | Wang |
| 6,495,964 B1 | 12/2002 | Muthu et al. |
| 6,509,913 B2 | 1/2003 | Martin, Jr. et al. |
| 6,580,258 B2 | 6/2003 | Wilcox et al. |
| 6,583,550 B2 | 6/2003 | Iwasa et al. |
| 6,636,003 B2 | 10/2003 | Rahm et al. |
| 6,688,753 B2 | 2/2004 | Calon et al. |
| 6,713,974 B2 | 3/2004 | Patchornik et al. |
| 6,727,832 B1 | 4/2004 | Melanson |
| 6,741,123 B1 | 5/2004 | Melanson et al. |
| 6,753,661 B2 | 6/2004 | Muthu et al. |
| 6,768,655 B1 | 7/2004 | Yang et al. |
| 6,781,351 B2 | 8/2004 | Mednik et al. |
| 6,788,011 B2 | 9/2004 | Mueller et al. |
| 6,806,659 B1 | 10/2004 | Mueller et al. |
| 6,839,247 B1 | 1/2005 | Yang |
| 6,860,628 B2 | 3/2005 | Robertson et al. |
| 6,870,325 B2 | 3/2005 | Bushell et al. |
| 6,873,065 B2 | 3/2005 | Haigh et al. |
| 6,882,552 B2 | 4/2005 | Telefus et al. |
| 6,888,322 B2 | 5/2005 | Dowling et al. |
| 6,894,471 B2 | 5/2005 | Corva et al. |
| 6,933,706 B2 | 8/2005 | Shih |
| 6,940,733 B2 | 9/2005 | Schie et al. |
| 6,944,034 B1 | 9/2005 | Shteynberg et al. |
| 6,956,750 B1 | 10/2005 | Eason et al. |
| 6,958,920 B2 | 10/2005 | Mednik et al. |
| 6,967,448 B2 | 11/2005 | Morgan et al. |
| 6,970,503 B1 | 11/2005 | Kalb |
| 6,975,079 B2 | 12/2005 | Lys et al. |
| 7,003,023 B2 | 2/2006 | Krone et al. |
| 7,050,509 B2 | 5/2006 | Krone et al. |
| 7,064,498 B2 | 6/2006 | Dowling et al. |
| 7,064,531 B1 | 6/2006 | Zinn |
| 7,075,329 B2 | 7/2006 | Chen et al. |
| 7,078,963 B1 | 7/2006 | Andersen et al. |
| 7,088,059 B2 | 8/2006 | McKinney et al. |
| 7,102,902 B1 | 9/2006 | Brown et al. |
| 7,106,603 B1 | 9/2006 | Lin et al. |
| 7,109,791 B1 | 9/2006 | Epperson et al. |
| 7,126,288 B2 | 10/2006 | Ribarich et al. |
| 7,135,824 B2 | 11/2006 | Lys et al. |
| 7,145,295 B1 | 12/2006 | Lee et al. |
| 7,158,633 B1 | 1/2007 | Hein |
| 7,161,816 B2 | 1/2007 | Shytenberg et al. |
| 7,183,957 B1 | 2/2007 | Melanson |
| 7,221,130 B2 | 5/2007 | Ribeiro et al. |
| 7,233,135 B2 | 6/2007 | Noma et al. |
| 7,246,919 B2 | 7/2007 | Porchia et al. |
| 7,255,457 B2 | 8/2007 | Ducharm et al. |
| 7,266,001 B1 | 9/2007 | Notohamiprodjo et al. |
| 7,288,902 B1 | 10/2007 | Melanson |
| 7,292,013 B1 | 11/2007 | Chen et al. |
| 7,310,244 B2 | 12/2007 | Yang et al. |
| 7,375,476 B2 | 5/2008 | Walter et al. |
| 7,511,437 B2 | 3/2009 | Lys et al. |
| 7,538,499 B2 | 5/2009 | Ashdown |
| 7,545,130 B2 | 6/2009 | Latham |
| 7,554,473 B2 | 6/2009 | Melanson |
| 7,569,996 B2 | 8/2009 | Holmes et al. |
| 7,656,103 B2 | 2/2010 | Shteynberg et al. |
| 2002/0145041 A1 | 10/2002 | Muthu et al. |
| 2002/0150151 A1 | 10/2002 | Krone et al. |
| 2002/0166073 A1 | 11/2002 | Nguyen et al. |
| 2003/0095013 A1 | 5/2003 | Melanson et al. |
| 2003/0223255 A1 | 12/2003 | Ben-Yaakov |
| 2004/0046683 A1 | 3/2004 | Mitamura et al. |
| 2004/0085030 A1 | 5/2004 | Laflamme et al. |
| 2004/0085117 A1 | 5/2004 | Melbert et al. |
| 2004/0169477 A1 | 9/2004 | Yancie et al. |
| 2004/0227571 A1 | 11/2004 | Kuribayashi |
| 2004/0228116 A1 | 11/2004 | Miller et al. |
| 2004/0232971 A1 | 11/2004 | Kawasaki et al. |
| 2004/0239262 A1 | 12/2004 | Ido et al. |
| 2005/0057237 A1 | 3/2005 | Clavel |
| 2005/0156770 A1 | 7/2005 | Melanson |
| 2005/0184895 A1 | 8/2005 | Petersen et al. |
| 2005/0207190 A1 | 9/2005 | Gritter |
| 2005/0218838 A1 | 10/2005 | Lys |
| 2005/0253533 A1 | 11/2005 | Lys et al. |
| 2005/0270813 A1 | 12/2005 | Zhang et al. |
| 2005/0275354 A1 | 12/2005 | Hausman, Jr. et al. |
| 2005/0275386 A1 | 12/2005 | Jepsen et al. |
| 2006/0022916 A1 | 2/2006 | Aiello |
| 2006/0023002 A1 | 2/2006 | Hara et al. |
| 2006/0125420 A1 | 6/2006 | Boone et al. |
| 2006/0226795 A1 | 10/2006 | Walter et al. |
| 2006/0238136 A1 | 10/2006 | Johnson, III et al. |
| 2006/0261754 A1 | 11/2006 | Lee |
| 2007/0029946 A1 | 2/2007 | Yu et al. |
| 2007/0040512 A1 | 2/2007 | Jungwirth et al. |

| | | | |
|---|---|---|---|
| 2007/0053182 | A1 | 3/2007 | Robertson |
| 2007/0103949 | A1 | 5/2007 | Tsuruya |
| 2007/0124615 | A1 | 5/2007 | Orr |
| 2007/0182699 | A1 | 8/2007 | Ha et al. |
| 2008/0130322 | A1 | 6/2008 | Artusi et al. |
| 2008/0174372 | A1 | 7/2008 | Tucker et al. |
| 2008/0192509 | A1 | 8/2008 | Dhuyvetter et al. |
| 2008/0224635 | A1 | 9/2008 | Hayes |
| 2008/0232141 | A1 | 9/2008 | Artusi et al. |
| 2008/0259655 | A1 | 10/2008 | Wei et al. |
| 2008/0278132 | A1 | 11/2008 | Kesterson et al. |
| 2009/0147544 | A1 | 6/2009 | Melanson |
| 2009/0218960 | A1 | 9/2009 | Lyons et al. |

FOREIGN PATENT DOCUMENTS

| | | |
|---|---|---|
| EP | 0910168 A1 | 4/1999 |
| EP | 1014563 | 6/2000 |
| EP | 1164819 A | 12/2001 |
| EP | 1213823 A2 | 6/2002 |
| EP | 1528785 A | 5/2005 |
| GB | 2069269 A | 8/1981 |
| WO | 01/15316 A1 | 1/2001 |
| WO | 01/97384 A | 12/2001 |
| WO | 02/15386 A2 | 2/2002 |
| WO | 0227944 | 4/2002 |
| WO | 02/091805 A2 | 11/2002 |
| WO | WO 2006/022107 A2 | 3/2006 |
| WO | 2006/067521 A | 6/2006 |
| WO | WO2006135584 | 12/2006 |
| WO | 2007/026170 A | 3/2007 |
| WO | 2007/079362 A | 7/2007 |

OTHER PUBLICATIONS

J. Zhou et al., Novel Sampling Algorithm for DSP Controlled 2 kW PFC Converter, IEEE Transactions on Power Electronics, vol. 16, No. 2, Mar. 2001.

A. Prodic, Compensator Design and Stability Assessment for Fast Voltage Loops of Power Factor Correction Rectifiers, IEEE Transactions on Power Electronics, vol. 22, No. 5, Sep. 2007.

M. Brkovic et al., "Automatic Current Shaper with Fast Output Regulation and Soft-Switching," S.15.C Power Converters, Telecommunications Energy Conference, 1993.

Dallas Semiconductor, Maxim, "Charge-Pump and Step-Up DC-DC Converter Solutions for Powering White LEDs in Series or Parallel Connections," Apr. 23, 2002.

Freescale Semiconductor, AN3052, Implementing PFC Average Current Mode Control Using the MC9S12E128, Nov. 2005.

D. Maksimovic et al., "Switching Converters with Wide DC Conversion Range," Institute of Electrical and Electronic Engineer's (IEEE) Transactions on Power Electronics, Jan. 1991.

V. Nguyen et al., "Tracking Control of Buck Converter Using Sliding-Mode with Adaptive Hysteresis," Power Electronics Specialists Conference, 1995. PESC apos; 95 Record., 26th Annual IEEE vol. 2, Issue , Jan. 18-22, 1995 pp. 1086-1093.

S. Zhou et al., "A High Efficiency, Soft Switching DC-DC Converter with Adaptive Current-Ripple Control for Portable Applications," IEEE Transactions on Circuits and Systems—II: Express Briefs, vol. 53, No. 4, Apr. 2006.

K. Leung et al., "Use of State Trajectory Prediction in Hysteresis Control for Achieving Fast Transient Response of the Buck Converter," Circuits and Systems, 2003. ISCAS apos;03. Proceedings of the 2003 International Symposium, vol. 3, Issue , May 25-28, 2003 pp. III-439-III-442 vol. 3.

K. Leung et al., "Dynamic Hysteresis Band Control of the Buck Converter with Fast Transient Response," IEEE Transactions on Circuits and Systems—II: Express Briefs, vol. 52, No. 7, Jul. 2005.

Y. Ohno, Spectral Design Considerations for White LED Color Rendering, Final Manuscript, Optical Engineering, vol. 44, 111302 (2005).

S. Skogstad et al., A Proposed Stability Characterization and Verification Method for High-Order Single-Bit Delta-Sigma Modulators, Norchip Conference, Nov. 2006 http://folk.uio.no/savskogs/pub/A_Proposed_Stability_Characterization.pdf.

J. Turchi, Four Key Steps to Design a Continuous Conduction Mode PFC Stage Using the NCP1653, ON Semiconductor, Publication Order No. AND184/D, Nov. 2004.

Megaman, D or S Dimming ESL, Product News, Mar. 15, 2007.

J. Qian et al., New Charge Pump Power-Factor-Correction Electronic Ballast with a Wide Range of Line Input Voltage, IEEE Transactions on Power Electronics, vol. 14, No. 1, Jan. 1999.

P. Green, A Ballast that can be Dimmed from a Domestic (Phase-Cut) Dimmer, IRPLCFL3 rev. b, International Rectifier, http://www.irf.com/technical-info/refdesigns/cfl-3.pdf, printed Mar. 24, 2007.

J. Qian et al., Charge Pump Power-Factor-Correction Technologies Part II: Ballast Applications, IEEE Transactions on Power Electronics, vol. 15, No. 1, Jan. 2000.

Chromacity Shifts in High-Power White LED Systems due to Different Dimming Methods, Solid-State Lighting, http://www.lrc.rpi.edu/programs/solidstate/completedProjects.asp?ID=76, printed May 3, 2007.

S. Chan et al., Design and Implementation of Dimmable Electronic Ballast Based on Integrated Inductor, IEEE Transactions on Power Electronics, vol. 22, No. 1, Jan. 2007.

M. Madigan et al., Integrated High-Quality Rectifier-Regulators, IEEE Transactions on Industrial Electronics, vol. 46, No. 4, Aug. 1999.

T. Wu et al., Single-Stage Electronic Ballast with Dimming Feature and Unity Power Factor, IEEE Transactions on Power Electronics, vol. 13, No. 3, May 1998.

F. Tao et al., "Single-Stage Power-Factor-Correction Electronic Ballast with a Wide Continuous Dimming Control for Fluorescent Lamps," IEEE Power Electronics Specialists Conference, vol. 2, 2001.

Azoteq, IQS17 Family, IQ Switch®—ProxSense™ Series, Touch Sensor, Load Control and User Interface, IQS17 Datasheet V2.00.doc, Jan. 2007.

C. Dilouie, Introducing the LED Driver, EC&M, Sep. 2004.

S. Lee et al., TRIAC Dimmable Ballast with Power Equalization, IEEE Transactions on Power Electronics, vol. 20, No. 6, Nov. 2005.

L. Gonthier et al., EN55015 Compliant 500W Dimmer with Low-Losses Symmetrical Switches, 2005 European Conference on Power Electronics and Applications, Sep. 2005.

Why Different Dimming Ranges? The Difference Between Measured and Perceived Light, http://www.lutron.com/ballast/pdf/LutronBallastpg3.pdf.

D. Hausman, Real-Time Illumination Stability Systems for Trailing-Edge (Reverse Phase Control) Dimmers, Technical White Paper, Lutron, version 1.0, Dec. 2004, http://www.lutron.com/technical_info/pdf/RTISS-TE.pdf.

Light Dimmer Circuits, www.epanorama.net/documents/lights/lightdimmer.html, printed Mar. 26, 2007.

Light Emitting Diode, http://en.wikipedia.org/wiki/Light-emitting_diode, printed Mar. 27, 2007.

Color Temperature, www.sizes.com/units/color_temperature.htm, printed Mar. 27, 2007.

S. Lee et al., A Novel Electrode Power Profiler for Dimmable Ballasts Using DC Link Voltage and Switching Frequency Controls, IEEE Transactions on Power Electronics, vol. 19, No. 3, May 2004.

Y. Ji et al., Compatibility Testing of Fluorescent Lamp and Ballast Systems, IEEE Transactions on Industry Applications, vol. 35, No. 6, Nov./Dec. 1999.

National Lighting Product Information Program, Specifier Reports, "Dimming Electronic Ballasts," vol. 7, No. 3, Oct. 1999.

Supertex Inc., Buck-based LED Drivers Using the HV9910B, Application Note AN-H48, Dec. 28, 2007.

D. Rand et al., Issues, Models and Solutions for Triac Modulated Phase Dimming of LED Lamps, Power Electronics Specialists Conference, 2007.

Supertex Inc., HV9931 Unity Power Factor LED Lamp Driver, Application Note AN-H52, Mar. 7, 2007.

Supertex Inc., 56W Off-line LED Driver, 120VAC with PFC, 160V, 350mA Load, Dimmer Switch Compatible, DN-H05, Feb. 2007.

ST Microelectronics, Power Factor Corrector L6561, Jun. 2004.

Fairchild Semiconductor, Application Note 42047 Power Factor Correction (PFC) Basics, Rev. 0.9.0 Aug. 19, 2004.
M. Radecker et al., Application of Single-Transistor Smart-Power IC for Fluorescent Lamp Ballast, Thirty-Fourth Annual Industry Applications Conference IEEE, vol. 1, Oct. 3, 1999-Oct. 7, 1999.
M. Rico-Secades et al., Low Cost Electronic Ballast for a 36-W Fluorescent Lamp Based on a Current-Mode-Controlled Boost Inverter for a 120-V DC Bus Power Distribution, IEEE Transactions on Power Electronics, vol. 21, No. 4, Jul. 2006.
Fairchild Semiconductor, FAN4800, Low Start-up Current PFC/PWM Controller Combos, Nov. 2006.
Fairchild Semiconductor, FAN4810, Power Factor Correction Controller, Sep. 24, 2003.
Fairchild Semiconductor, FAN4822, ZVS Average Current PFC Controller, Aug. 10, 2001.
Fairchild Semiconductor, FAN7527B, Power Factor Correction Controller, 2003.
Fairchild Semiconductor, ML4821, Power Factor Controller, Jun. 19, 2001.
Freescale Semiconductor, AN1965, Design of Indirect Power Factor Correction Using 56F800/E, Jul. 2005.
International Search Report for PCT/US2008/051072, mailed Jun. 4, 2008.
Infineon, CCM-PFC Standalone Power Factor Correction (PFC) Controller in Continuous Conduction Mode (CCM), Version 2.1, Feb. 6, 2007.
International Rectifier, IRAC1150-300W Demo Board, User's Guide, Rev 3.0, Aug. 2, 2005.
International Rectifier, Application Note AN-1077,PFC Converter Design with IR1150 One Cycle Control IC, rev. 2.3, Jun. 2005.
International Rectifier, Data Sheet PD60230 revC, Feb. 5, 2007.
Lu et al., International Rectifier, Bridgeless PFC Implementation Using One Cycle Control Technique, 2005.
Linear Technology, LT1248, Power Factor Controller, Apr. 20, 2007.
ON Semiconductor, AND8123/D, Power Factor Correction Stages Operating in Critical Conduction Mode, Sep. 2003.
ON Semiconductor, MC33260, GreenLine Compact Power Factor Controller: Innovative Circuit for Cost Effective Solutions, Sep. 2005.
ON Semiconductor, NCP1605, Enhanced, High Voltage and Efficient Standby Mode, Power Factor Controller, Feb. 2007.
ON Semconductor, NCP1606, Cost Effective Power Factor Controller, Mar. 2007.
ON Semiconductor, NCP1654, Product Review, Power Factor Controller for Compact and Robust, Continuous Conduction Mode Pre-Converters, Mar. 2007.
Philips, Application Note, 90W Resonant SMPS with TEA1610 SwingChip, AN99011, 1999.
NXP, TEA1750, GreenChip III SMPS control IC Product Data Sheet, Apr. 6, 2007.
Renesas, HA16174P/FP, Power Factor Correction Controller IC, Jan. 6, 2006.
Renesas Technology Releases Industry's First Critical-Conduction-Mode Power Factor Correction Control IC Implementing Interleaved Operation, Dec. 18, 2006.
Renesas, Application Note R2A20111 EVB, PFC Control IC R2A20111 Evaluation Board, Feb. 2007.
STMicroelectronics, L6563, Advanced Transition-Mode PFC Controller, Mar. 2007.
Texas Instruments, Application Note SLUA321, Startup Current Transient of the Leading Edge Triggered PFC Controllers, Jul. 2004.
Texas Instruments, Application Report, SLUA309A, Avoiding Audible Noise at Light Loads when using Leading Edge Triggered PFC Converters, Sep. 2004.
Texas Instruments, Application Report SLUA369B, 350-W, Two-Phase Interleaved PFC Pre-Regulator Design Review, Mar. 2007.
Unitrode, High Power-Factor Preregulator, Oct. 1994.
Texas Instruments, Transition Mode PFC Controller, SLUS515D, Jul. 2005.
Unitrode Products From Texas Instruments, Programmable Output Power Factor Preregulator, Dec. 2004.
Unitrode Products From Texas Instruments, High Performance Power Factor Preregulator, Oct. 2005.
Texas Instruments, UCC3817 BiCMOS Power Factor Preregulator Evaluation Board User's Guide, Nov. 2002.
Unitrode, L. Balogh, Design Note UC3854A/B and UC3855A/B Provide Power Limiting with Sinusoidal Input Current for PFC Front Ends, SLUA196A, Nov. 2001.
A. Silva De Morais et al., A High Power Factor Ballast Using a Single Switch with Both Power Stages Integrated, IEEE Transactions on Power Electronics, vol. 21, No. 2, Mar. 2006.
M. Ponce et al., High-Efficient Integrated Electronic Ballast for Compact Fluorescent Lamps, IEEE Transactions on Power Electronics, vol. 21, No. 2, Mar. 2006.
A. R. Seidel et al., A Practical Comparison Among High-Power-Factor Electronic Ballasts with Similar Ideas, IEEE Transactions on Industry Applications, vol. 41, No. 6, Nov.-Dec. 2005.
F. T. Wakabayashi et al., An Improved Design Procedure for LCC Resonant Filter of Dimmable Electronic Ballasts for Fluorescent Lamps, Based on Lamp Model, IEEE Transactions on Power Electronics, vol. 20, No. 2, Sep. 2005.
J. A. Vilela Jr. et al., An Electronic Ballast with High Power Factor and Low Voltage Stress, IEEE Transactions on Industry Applications, vol. 41, No. 4, Jul./Aug. 2005.
S. T.S. Lee et al., Use of Saturable Inductor to Improve the Dimming Characteristics of Frequency-Controlled Dimmable Electronic Ballasts, IEEE Transactions on Power Electronics, vol. 19, No. 6, Nov. 2004.
M. K. Kazimierczuk et al., Electronic Ballast for Fluorescent Lamps, IEEE Transactions on Power Electronics, vol. 8, No. 4, Oct. 1993.
S. Ben-Yaakov et al., Statics and Dynamics of Fluorescent Lamps Operating at High Frequency: Modeling and Simulation, IEEE Transactions on Industry Applications, vol. 38, No. 6, Nov.-Dec. 2002.
H. L. Cheng et al., A Novel Single-Stage High-Power-Factor Electronic Ballast with Symmetrical Topology, IEEE Transactions on Power Electronics, vol. 50, No. 4, Aug. 2003.
J.W.F. Dorleijn et al., Standardisation of the Static Resistances of Fluorescent Lamp Cathodes and New Data for Preheating, Industry Applications Conference, vol. 1, Oct. 13, 2002-Oct. 18, 2002.
Q. Li et al., An Analysis of the ZVS Two-Inductor Boost Converter under Variable Frequency Operation, IEEE Transactions on Power Electronics, vol. 22, No. 1, Jan. 2007.
H. Peng et al., Modeling of Quantization Effects in Digitally Controlled DC-DC Converters, IEEE Transactions on Power Electronics, vol. 22, No. 1, Jan. 2007.
G.Yao et al., Soft Switching Circuit for Interleaved Boost Converters, IEEE Transactions on Power Electronics, vol. 22, No. 1, Jan. 2007.
C. M. De Oliviera Stein et al., A ZCT Auxiliary Communication Circuit for Interleaved Boost Converters Operating in Critical Conduction Mode, IEEE Transactions on Power Electronics, vol. 17, No. 6, Nov. 2002.
W. Zhang et al., A New Duty Cycle Control Strategy for Power Factor Correction and FPGA Implementation, IEEE Transactions on Power Electronics, vol. 21, No. 6, Nov. 2006.
H. Wu et al., Single Phase Three-Level Power Factor Correction Circuit with Passive Lossless Snubber, IEEE Transactions on Power Electronics, vol. 17, No. 2, Mar. 2006.
O. Garcia et al., High Efficiency PFC Converter to Meet EN61000-3-2 and A14, Proceedings of the 2002 IEEE International Symposium on Industrial Electronics, vol. 3, 2002.
P. Lee et al., Steady-State Analysis of an Interleaved Boost Converter with Coupled Inductors, IEEE Transactions on Industrial Electronics, vol. 47, No. 4, Aug. 2000.
D.K.W. Cheng et al., A New Improved Boost Converter with Ripple Free Input current Using Coupled Inductors, Power Electronics and Variable Speed Drives, Sep. 21-23, 1998.
B.A. Miwa et al., High Efficiency Power Factor Correction Using Interleaved Techniques, Applied Power Electronics Conference and Exposition, Seventh Annual Conference Proceedings, Feb. 23-27, 1992.
Z. Lai et al., A Family of Power-Factor-Correction Controllers, Twelfth Annual Applied Power Electronics Conference and Exposition, vol. 1, Feb. 23, 1997-Feb. 27, 1997.

L. Balogh et al., Power-Factor Correction with Interleaved Boost Converters in continuous-Inductor-Current Mode, Eighth Annual Applied Power Electronics Conference and Exposition, 1993. APEC '93. Conference Proceedings, Mar. 7, 1993-Mar. 11, 1993.

Fairchild Semiconductor, Application Note 42030, Theory and Application of the ML4821 Average Current Mode PFC Controller, Oct. 25, 2000.

Unitrode Products From Texas Instruments, BiCMOS Power Factor Preregulator, Feb. 2006.

D. Hausman, Lutron, RTISS-TE Operation, Real-Time Illumination Stability Systems for Trailing-Edge (Reverse Phase Control) Dimmers, v. 1.0 Dec. 2004.

International Rectifier, Data Sheet No. PD60230 revC, IR1150(S)(PbF), uPFC One Cycle Control PFC IC Feb. 5, 2007.

Texas Instruments, Application Report SLUA308, UCC3817 Current Sense Transformer Evaluation, Feb. 2004.

Texas Instruments, Application Report SPRA902A, Average Current Mode Controlled Power Factor Correctiom Converter using TMS320LF2407A, Jul. 2005.

Unitrode, Design Note DN-39E, Optimizing Performance in UC3854 Power Factor Correction Applications, Nov. 1994.

Fairchild Semiconductor, Application Note 42030, Theory and Application of the ML4821 Average Currrent Mode PFC Controller, Aug. 1997.

Fairchild Semiconductor, Application Note AN4121, Design of Power Factor Correction Circuit Using FAN7527B, Rev.1.0.1, May 30, 2002.

Fairchild Semiconductor, Application Note 6004, 500W Power-Factor-Corrected (PFC) Converter Design with FAN4810, Rev. 1.0.1, Oct. 31, 2003.

Fairchild Semiconductor, FAN4822, ZVA Average Current PFC Controller, Rev. 1.0.1 Aug. 10, 2001.

Fairchild Semiconductor, ML4821, Power Factor Controller, Rev. 1.0.2, Jun. 19, 2001.

Fairchild Semiconductor, ML4812, Power Factor Controller, Rev. 1.0.4, May 31, 2001.

Linear Technology, 100 Watt LED Driver, undated.

Fairchild Semiconductor, FAN7544, Simple Ballast Controller, Rev. 1.0.0.

Fairchild Semiconductor, FAN7532, Ballast Controller, Rev. 1.0.2.

Fairchild Semiconductor, FAN7711, Ballast Control IC, Rev. 1.0.2.

Fairchild Semiconductor, KA7541, Simple Ballast Controller, Rev. 1.0.3.

ST Microelectronics, L6574, CFL/TL Ballast Driver Preheat and Dimming, Sep. 2003.

ST Microelectronics, AN993, Application Note, Electronic Ballast with PFC Using L6574 and L6561, May 2004.

Power Integrations, Inc., "TOP200-4/14 TOPSwitch Family Three-terminal Off-line PWM Switch", XP-002524650, Jul. 1996, Sunnyvale, California.

Texas Instruments, SLOS318F, "High-Speed, Low Noise, Fully-Differential I/O Amplifiers," THS4130 and THS4131, US, Jan. 2006.

International Search Report and Written Opinion, PCT US20080062387, dated Feb. 5, 2008.

International Search Report and Written Opinion, PCT US200900032358, dated Jan. 29, 2009.

Hirota, Atsushi et al, "Analysis of Single Switch Delta-Sigma Modulated Pulse Space Modulation PFC Converter Effectively Using Switching Power Device," IEEE, US, 2002.

Prodic, Aleksandar, "Digital Controller for High-Frequency Rectifiers with Power Factor Correction Suitable for On-Chip Implementation," IEEE, US, 2007.

International Search Report and Written Opinion, PCT US20080062378, dated Feb. 5, 2008.

International Search Report and Written Opinion, PCT US20090032351, dated Jan. 29, 2009.

Erickson, Robert W. et al, "Fundamentals of Power Electronics," Second Edition, Chapter 6, Boulder, CO, 2001.

Allegro Microsystems, A1442, "Low Voltage Full Bridge Brushless DC Motor Driver with Hall Commutation and Soft-Switching, and Reverse Battery, Short Circuit, and Thermal Shutdown Protection," Worcester MA, 2009.

Texas Instruments, SLUS828B, "8-Pin Continuous Conduction Mode (CCM) PFC Controller", UCC28019A, US, revised Apr. 2009.

Analog Devices, "120 kHz Bandwidth, Low Distortion, Isolation Amplifier", AD215, Norwood, MA, 1996.

Burr-Brown, ISO120 and ISO121, "Precision Los Cost Isolation Amplifier," Tucson AZ, Mar. 1992.

Burr-Brown, ISO130, "High IMR, Low Cost Isolation Amplifier," SBOS220, US, Oct. 2001.

International Search Report and Written Report PCT US20080062428 dated Feb. 5, 2008.

Prodic, A. et al, "Dead Zone Digital Controller for Improved Dynamic Response of Power Factor Preregulators," IEEE, 2003.

"HV9931 Unity Power Factor LED Lamp Driver, Initial Release", Supertex Inc., Sunnyvale, CA USA 2005.

"AN-H52 Application Note: HV9931 Unity Power Factor LED Lamp Driver" Mar. 7, 2007, Supertex Inc., Sunnyvale, CA, USA.

Dustin Rand et al: "Issues, Models and Solutions for Triac Modulated Phase Dimming of LED Lamps" Power Electronics Specialists Conference, 2007. PESC 2007. IEEE, IEEE, P1, Jun. 1, 2007, pp. 1398-1404.

Spiazzi G et al: "Analysis of a High-Power Factor Electronic Ballast for High Brightness Light Emitting Diodes" Power Electronics Specialists, 2005 IEEE 36th Conference on Jun. 12, 2005, Piscatawa, NJ, USA, IEEE, Jun. 12, 2005, pp. 1494-1499.

International Search Report PCT/US2008/062381 dated Feb. 5, 2008.

International Search Report PCT/US2008/056739 dated Dec. 3, 2008.

Written Opinion of the International Searching Authority PCT/US2008/062381 dated Feb. 5, 2008.

Ben-Yaakov et al, "The Dynamics of a PWM Boost Converter with Resistive Input" IEEE Transactions on Industrial Electronics, IEEE Service Center, Piscataway, NJ, USA, vol. 46, No. 3, Jun. 1, 1999.

International Search Report PCT/US2008/062398 dated Feb. 5, 2008.

Partial International Search Report PCT/US2008/062387 dated Feb. 5, 2008.

Noon, Jim "UC3855A/B High Performance Power Factor Preregulator", Texas Instruments, SLUA146A, May 1996, Revised Apr. 2004.

International Search Report PCT/GB2006/003259 dated Jan. 12, 2007.

Written Opinion of the International Searching Authority PCT/US2008/056739 dated Dec. 3, 2008.

International Search Report PCT/US2008/056606 dated Dec. 3, 2008.

Written Opinion of the International Searching Authority PCT/US2008/056606 dated Dec. 3, 2008.

International Search Report PCT/US2008/056608 dated Dec. 3, 2008.

Written Opinion of the International Searching Authority PCT/US2008/056608 dated Dec. 3, 2008.

International Search Report PCT/GB2005/050228 dated Mar. 14, 2006.

International Search Report PCT/US2008/062387 dated Jan. 10, 2008.

Data Sheet LT3496 Triple Output LED Driver, Linear Technology Corporation, Milpitas, CA 2007.

Linear Technology, News Release,Triple Output LED, LT3496, Linear Technology, Milpitas, CA, May 24, 2007.

ST Datasheet L6562, Transition-Mode PFC Controller, 2005, STMicroelectronics, Geneva, Switzerland.

Maksimovic, Regan Zane and Robert Erickson, Impact of Digital Control in Power Electronics, Proceedings of 2004 International Symposium on Power Semiconductor Devices & Ics, Kitakyushu, , Apr. 5, 2010, Colorado Power Electronics Center, ECE Department, University of Colorado, Boulder, CO.

Linear Technology, "Single Switch PWM Controller with Auxiliary Boost Converter," LT1950 Datasheet, Linear Technology, Inc. Milpitas, CA, 2003.

Yu, Zhenyu, 3.3V DSP for Digital Motor Control, Texas Instruments, Application Report SPRA550 dated Jun. 1999.

International Rectifier, Data Sheet No. PD60143-O, Current Sensing Single Channel Driver, El Segundo, CA, dated Sep. 8, 2004.

Balogh, Laszlo, "Design and Application Guide for High Speed MOSFET Gate Drive Circuits" [Online] 2001, Texas Instruments, Inc., SEM-1400, Unitrode Power Supply Design Seminar, Topic II, TI literature No. SLUP133, XP002552367, Retrieved from the Internet: URL:htt/://focus.ti.com/lit/ml/slup169/slup169.pdf the whole document.

International Search Report and Written Opinion for PCT/US2008/062384 dated Jan. 14, 2008.

S. Dunlap et al., Design of Delta-Sigma Modulated Switching Power Supply, Circuits & Systems, Proceedings of the 1998 IEEE International Symposium, 1998.

Texas Instruments, Interleaving Continuous Conduction Mode PFC Controller, UCC28070, SLUS794C, Nov. 2007, revised Jun. 2009, Texas Instruments, Dallas TX.

* cited by examiner

POWER SUPPLY DC VOLTAGE OFFSET DETECTOR

CROSS-REFERENCE TO RELATED APPLICATION

This application claims the benefit under 35 U.S.C. §119 (e) and 37 C.F.R. §1.78 of U.S. Provisional Application No. 60/915,547, filed May 2, 2007, and entitled "Power Factor Correction (PFC) Controller Apparatuses and Methods," and is incorporated by reference in its entirety.

U.S. patent application entitled "Power Factor Correction Controller With Feedback Reduction", inventor John L. Melanson, assignee Cirrus Logic, Inc., Ser. No. 11/967,271 ("Melanson I"). Melanson I is incorporated herein by reference in its entirety.

U.S. patent application entitled "Power Factor Correction Controller With Switch Node Feedback", inventor John L. Melanson, assignee Cirrus Logic, Inc., Ser. No. 11/967,272 ("Melanson II"). Melanson II is incorporated herein by reference in its entirety.

BACKGROUND OF THE INVENTION

1. Field of the Invention

The present invention relates in general to the field of signal processing, and, more specifically, to a power factor correction controller with a power supply DC offset detector.

2. Description of the Related Art

Power control systems provide power factor corrected and regulated output voltages to many devices that utilize a regulated output voltage. FIG. 1 depicts a power control system 100, which includes a switching power converter 102. The switching power converter 102 performs power factor correction and provides constant voltage power to load 112. Voltage source 101 supplies an alternating current (AC) input voltage $V_{in}(t)$ to a full, diode bridge rectifier 103. The voltage source 101 is, for example, a public utility, and the AC voltage $V_{in}(t)$ is, for example, a 60 Hz/110 V line voltage in the United States of America or a 50 Hz/220 V line voltage in Europe. The rectifier 103 rectifies the input voltage $V_{in}(t)$ and supplies a rectified, time-varying, line input voltage $V_x(t)$ to the switching power converter.

The switching power converter 102 includes power factor correction (PFC) stage 124 and driver stage 126. The PFC stage 124 is controlled by switch 108 and provides power factor correction. The driver stage 126 is also controlled by switch 108 and regulates the transfer of energy from the line input voltage $V_x(t)$ through inductor 110 to capacitor 106. The inductor current $i_L$ ramps 'up' when the switch 108 conducts, i.e. is "ON". The inductor current $i_L$ ramps down when switch 108 is nonconductive, i.e. is "OFF", and supplies current $i_L$ to recharge capacitor 106. The time period during which inductor current $i_L$ ramps down is commonly referred to as the "inductor flyback time". In at least one embodiment, the switching power converter 102 operates in discontinuous current mode, i.e. the inductor current $i_L$ ramp up time plus the inductor flyback time is less than the period of switch 108.

Capacitor 106 supplies stored energy to load 112 while the switch 108 conducts. The capacitor 106 is sufficiently large so as to maintain a substantially constant output voltage $V_c(t)$, as established by a power factor correction (PFC) and output voltage controller 114 (as discussed in more detail below). The output voltage $V_c(t)$ remains substantially constant during constant load conditions. However, as load conditions change, the output voltage $V_c(t)$ changes. The PFC and output voltage controller 114 responds to the changes in $V_c(t)$ and adjusts the control signal $CS_0$ to maintain a substantially constant output voltage as quickly as possible. The output voltage controller 114 includes a small capacitor 115 to filter any high frequency signals from the line input voltage $V_x(t)$.

The power control system 100 also includes a PFC and output voltage controller 114 to control the switch 108 and, thus, control power factor correction and regulate output power of the switching power converter 102. The goal of power factor correction technology is to make the switching power converter 102 appear resistive to the voltage source 101. Thus, the PFC and output voltage controller 114 attempts to control the inductor current $i_L$ so that the average inductor current $i_L$ is linearly and directly related to the line input voltage $V_x(t)$. Prodić, *Compensator Design and Stability Assessment for Fast Voltage Loops of Power Factor Correction Rectifiers*, IEEE Transactions on Power Electronics, Vol. 22, No. 5, September 2007, pp. 1719-1729 (referred to herein as "Prodić"), describes an example of PFC and output voltage controller 114. The PFC and output voltage controller 114 supplies a pulse width modified (PWM) control signal $CS_0$ to control the conductivity of switch 108. In at least one embodiment, switch 108 is a field effect transistor (FET), and control signal $CS_0$ is the gate voltage of switch 108. The values of the pulse width and duty cycle of control signal $CS_0$ depend on two feedback signals, namely, the line input voltage $V_x(t)$ and the capacitor voltage/output voltage $V_c(t)$.

Switching power converter 114 receives two feedback signals, the line input voltage $V_x(t)$ and the output voltage $V_c(t)$, via a wide bandwidth current loop 116 and a slower voltage loop 118. The line input voltage $V_x(t)$ is sensed from node 120 between the diode rectifier and inductor 110. The output voltage $V_c(t)$ is sensed from node 122 between diode 111 and load 112. The current loop 116 operates at a frequency $f_c$ that is sufficient to allow the PFC and output controller 114 to respond to changes in the line input voltage $V_x(t)$ and cause the inductor current $i_L$ to track the line input voltage to provide power factor correction. The current loop frequency is generally set to a value between 20 kHz and 150 kHz. The voltage loop 118 operates at a much slower frequency $f_v$, typically 10-20 Hz. As subsequently described in more detail, the capacitor voltage $V_c(t)$ includes an AC component (sometimes referred to herein as a "ripple") having a frequency equal to twice the frequency of input voltage $V_{in}(t)$, e.g. 120 Hz. Thus, by operating at 10-20 Hz, the voltage loop 118 functions as a low pass filter to filter the ripple component.

FIG. 2 depicts an output voltage $V_c(t)$ versus time graph 200. Referring to FIGS. 1 and 2, the output voltage $V_c(t)$ supplied by power control system 100 includes a direct current (DC) component, i.e. the DC offset for voltage $V_c(t)$, and an exemplary AC component, e.g. ripple 202. Ripple 202 is generally triangular shaped. However, ripple 202 can be any waveform. Ripple 202 is depicted with a "dense" line because ripple 202 generally contains many high frequency noise perturbations. The noise is, for example, caused by noise across the inductor 110 and noise from load 112. In at least one embodiment, load 112 includes another switching power converter, and an inductor corresponding to inductor 110 can cause noise to appear at the output of switching power converter 102. Thus, ripple 202 is generally not a 'clean' waveform, such as a sine wave. Rather, ripple 202 has, for example, a generally triangular shape with many noise perturbations. The primary frequency $f_R$ of the ripple 202 is twice the line frequency $f_L$ of input voltage $V_{in}(t)$. For example, for a line frequency $f_L=60$ Hz, the ripple frequency $f_R=2 \cdot f_L=2 \cdot 60$ Hz=120 Hz. The DC offset for voltage $V_c(t)$ can change over time due to input power fluctuations and load power demand fluctuations. Thus, the PFC and output voltage controller 114 monitors the output voltage $V_c(t)$ and adjusts the control signal $CS_0$ to return the output voltage $V_c(t)$ to the desired value.

The ripple 202 can adversely influence the determination of the control signal $CS_0$ by PFC and output voltage controller 114. To minimize the influence of ripple 202 on the control signal $CS_0$, the voltage loop 118 operates at a much slower frequency $f_v$, typically 10-20 Hz, than the line frequency $f_L$. By operating at 10-20 Hz, the voltage loop 118 functions as a low pass filter to filter out ripple 202. However, operating at 10-20 Hz also slows the response of PFC and output voltage controller 114 to changes in the output voltage $V_c(t)$.

FIG. 3 depicts a generalized representation of a power control system 300 described in Prodić. The PFC and output voltage controller 302 of Prodić includes an error generator 304 to determine an error signal $e_d(t)$. The error signal $e_d(t)$ represents a difference between the output voltage $V_c(t)$ and a reference voltage $V_{REF}$. The reference voltage $V_{REF}$ is set to the desired value of output voltage $V_c(t)$. A comb filter 306 filters the error signal $e_d(t)$. The comb filter 306 has significant attenuation at equally spaced frequencies (referred to as "notches") and has unity gain at other frequencies. The comb filter 306 automatically tunes the notches to match twice the line frequency $f_L$ and harmonics of the line frequency. According to Prodić, the comb filter 306 generates a "ripple free" error signal $e_{vf}(t)$. Compensator 308 processes the filtered error signal and input voltage feedback signal $V_x(t)$ generates a compensator output signal. The pulse width modulator (PWM) 310 processes the compensator output signal to generate control signal $CS_0$. However, the comb filter 306 notches should be accurate to precisely match the line frequency $f_L$ and harmonics thereof and avoid aliasing.

SUMMARY OF THE INVENTION

In one embodiment of the present invention, an apparatus includes a power supply output voltage direct current (DC) offset detector, wherein an output voltage of a power supply comprises a ripple component and a DC offset. The power supply output voltage DC offset detector includes a comparator to generate a comparison signal during a period of the ripple component, wherein the comparison signal represents a comparison between the ripple component and a reference voltage. The power supply output voltage DC offset detector also includes a processor, coupled to the comparator, configured to determine, based on the comparison signal, at least one of: (i) a first duration for which the ripple component is above the reference voltage and (ii) a second duration for which the ripple component is below the reference voltage. The power supply output voltage DC offset detector is further configured to use the first and second ripple component durations to determine the DC offset of the output voltage during the period of the ripple component.

In another embodiment of the present invention, a method to determine a direct current (DC) offset of an output voltage of a power supply, wherein the output voltage comprises a periodic ripple component and a DC offset, includes generating a comparison signal during a period of the ripple component, wherein the comparison signal represents a comparison between the ripple component and a reference voltage. The method further includes determining, based on the comparison signal, at least one of: (i) a first duration for which the ripple component is above the reference voltage and (ii) a second duration for which the ripple component is below the reference voltage. The method also includes using the first and second ripple component durations to determine the DC offset of the output voltage during the period of the ripple component.

In a further embodiment of the present invention, a sampling module to sample a power supply output voltage includes a comparator to generate a comparison signal during a period of a ripple component. The power supply output voltage includes a ripple component and a DC offset. The comparison signal represents a comparison between the ripple component and a reference voltage. The sampling module also includes a processor coupled to the comparator. The processor is configured to determine, based on the comparison signal, a duration for which the ripple component is above the reference voltage. The processor is further configured to use the duration for which the ripple component is above the reference voltage and the period of the ripple component to determine a sample of the output voltage during the period of the ripple component.

In another embodiment of the present invention, a sampling module to sample a power supply output voltage includes a comparator to generate a comparison signal during a period of a ripple component. The power supply output voltage includes the ripple component and a DC offset. The comparison signal represents a comparison between the ripple component and a reference voltage. The sampling module also includes a processor coupled to the comparator. The processor is configured to determine, based on the comparison signal, a duration for which the ripple component is below the reference voltage. The processor is further configured to use the duration for which the ripple component is below the reference voltage and use the period of the ripple component to determine a sample of the output voltage during the period of the ripple component.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

A power supply output voltage direct current (DC) offset detector determines a DC offset in a power supply output voltage signal, and the output voltage signal has a DC component and an alternating current (AC) "ripple" component. Once during each period of the ripple, the DC offset detector determines the DC offset from an output voltage signal using a comparison between the output voltage signal and a reference voltage. In at least one embodiment, from the comparison and during a period of the ripple, the DC offset detector determines an 'above' duration for which the ripple is above the reference voltage, determines a 'below' duration for which the ripple is below the reference voltage, or both to determine the DC offset of the power supply output voltage signal. The DC offset detector uses the above and/or below duration(s) to determine the DC offset of the output voltage signal. Thus, the DC offset detector effectively samples the voltage signal at a sampling frequency equal to a frequency of the ripple and filters out the ripple from the output voltage signal to determine a sampled power supply output voltage effectively uninfluenced by the ripple.

In at least one embodiment, the duration 'above' and/or 'below' is determined in terms of a number of cycles in a clock signal of the DC detector. In at least one embodiment and based on the comparison signal, the DC offset detector determines a fraction of the total duration of a period of the ripple when the ripple is above the reference voltage and uses the fraction to determine the DC offset of the output voltage signal. In at least one embodiment, the ripple frequency is twice a frequency of an input voltage supplied to the power supply. In at least one embodiment, the DC offset detector provides the sampled output voltage signal to a PFC and output voltage controller, and the PFC and output voltage controller utilizes the sampled power supply voltage to determine a control signal to control a switching power converter. The durations of the ripple above and/or below the reference voltage can be measured in terms of clock cycles, time intervals, or any other duration measurement unit.

Figure 1:
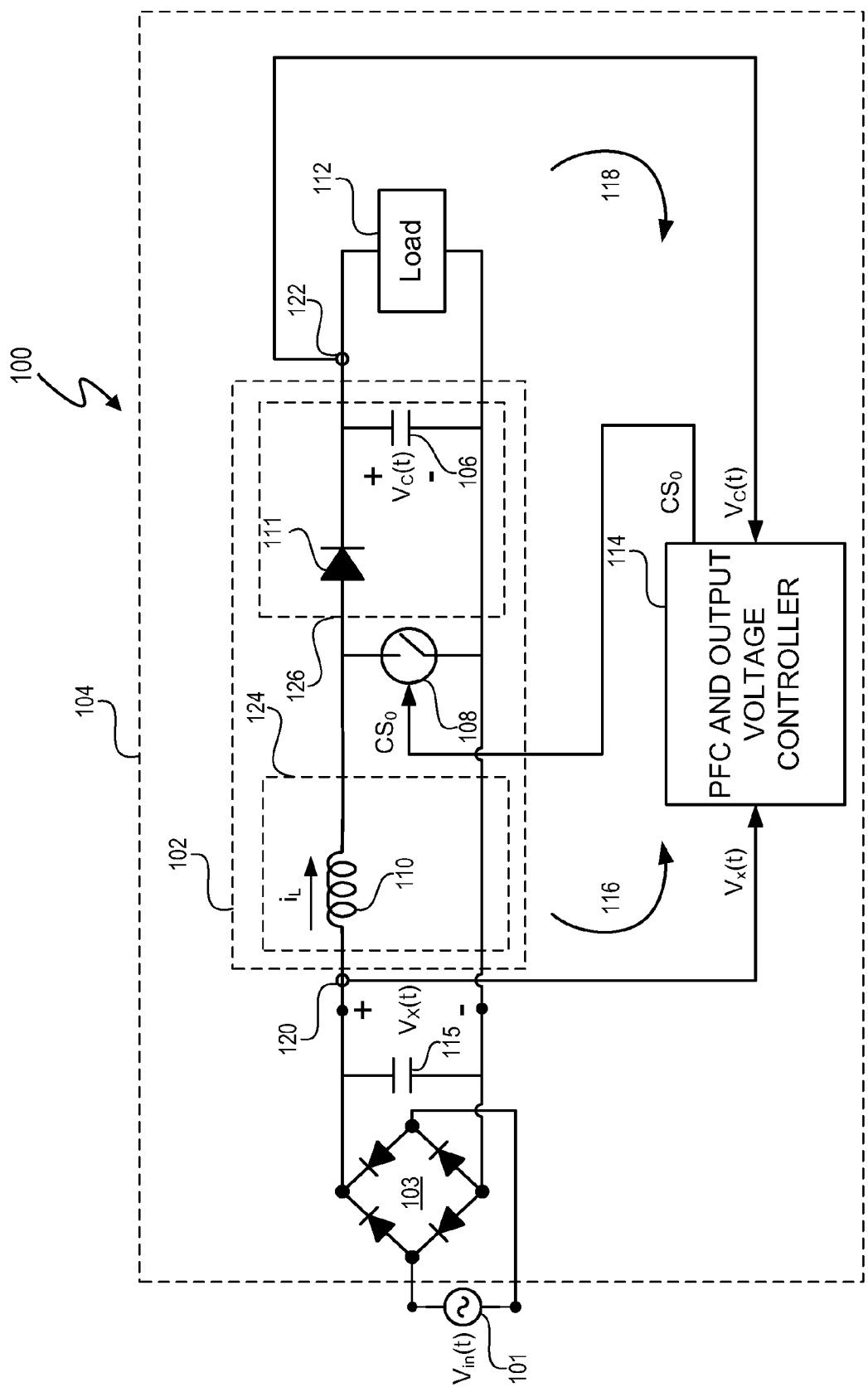
FIG. 1 (labeled prior art) depicts a power control system.
Figure 2:
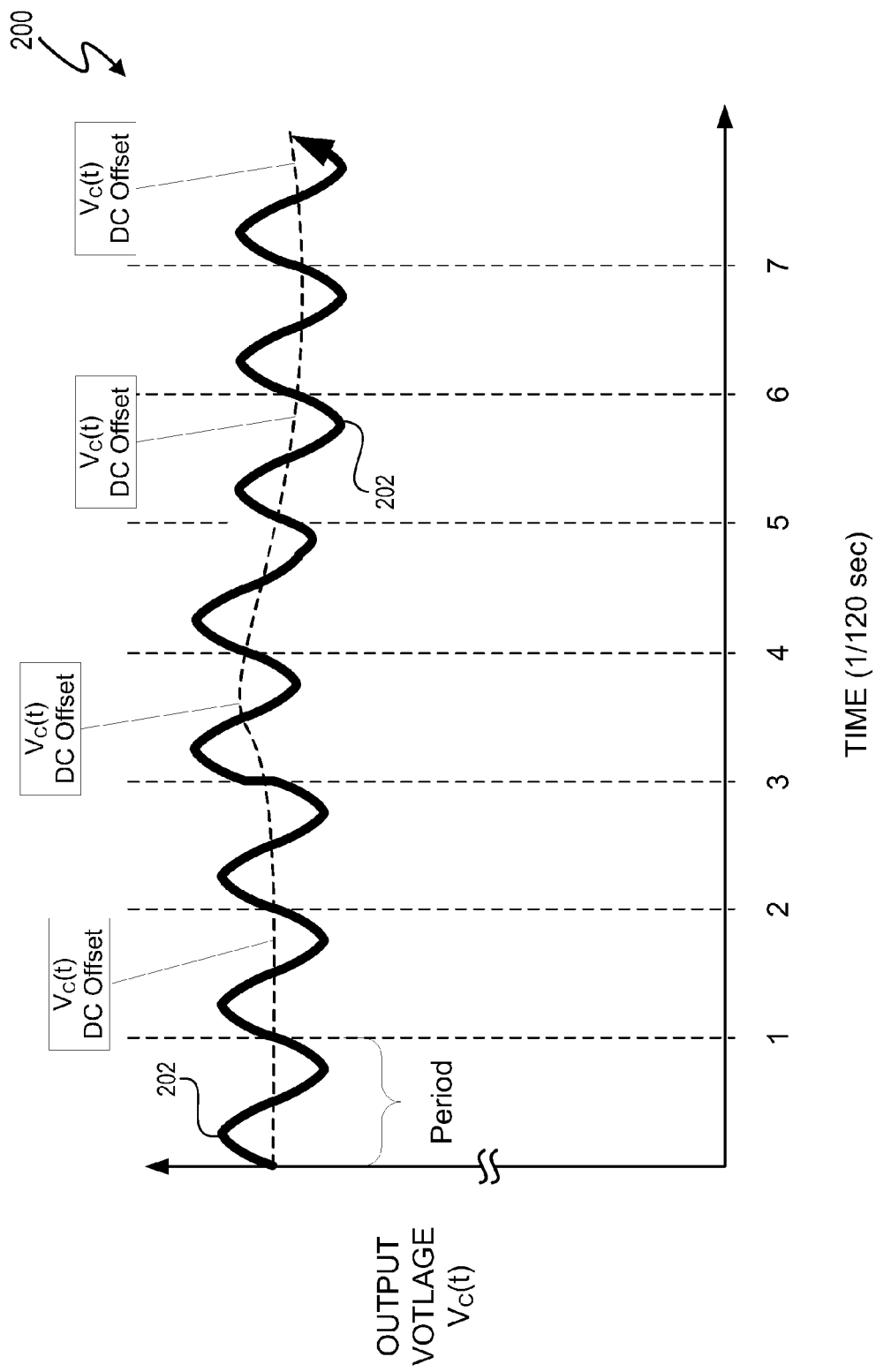
FIG. 2 (labeled prior art) depicts a power control system output voltage with an alternating current ripple component versus time graph.
Figure 3:
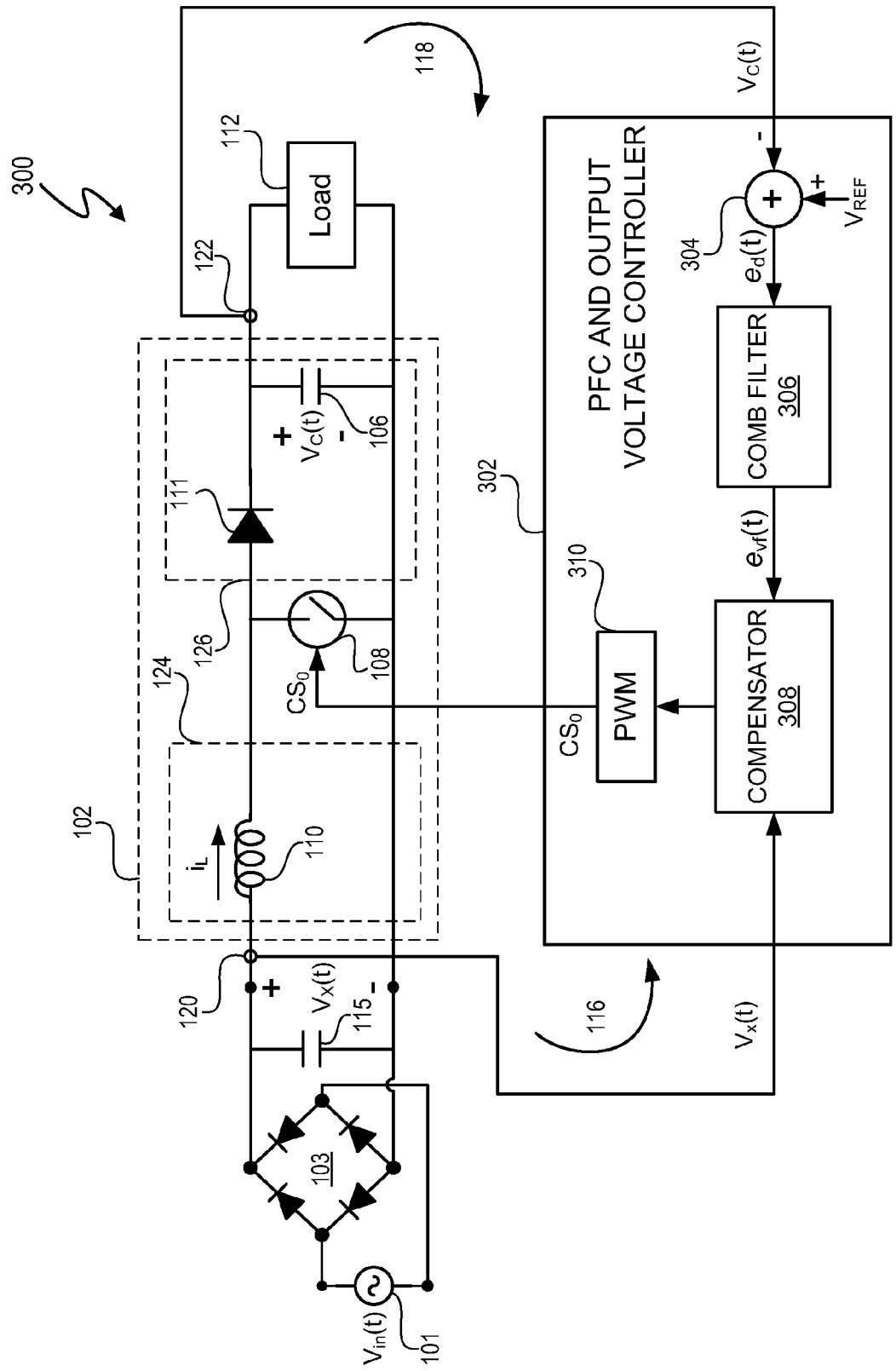
FIG. 3 (labeled prior art) depicts a power and control system with an output voltage feedback filter.
Figure 4:
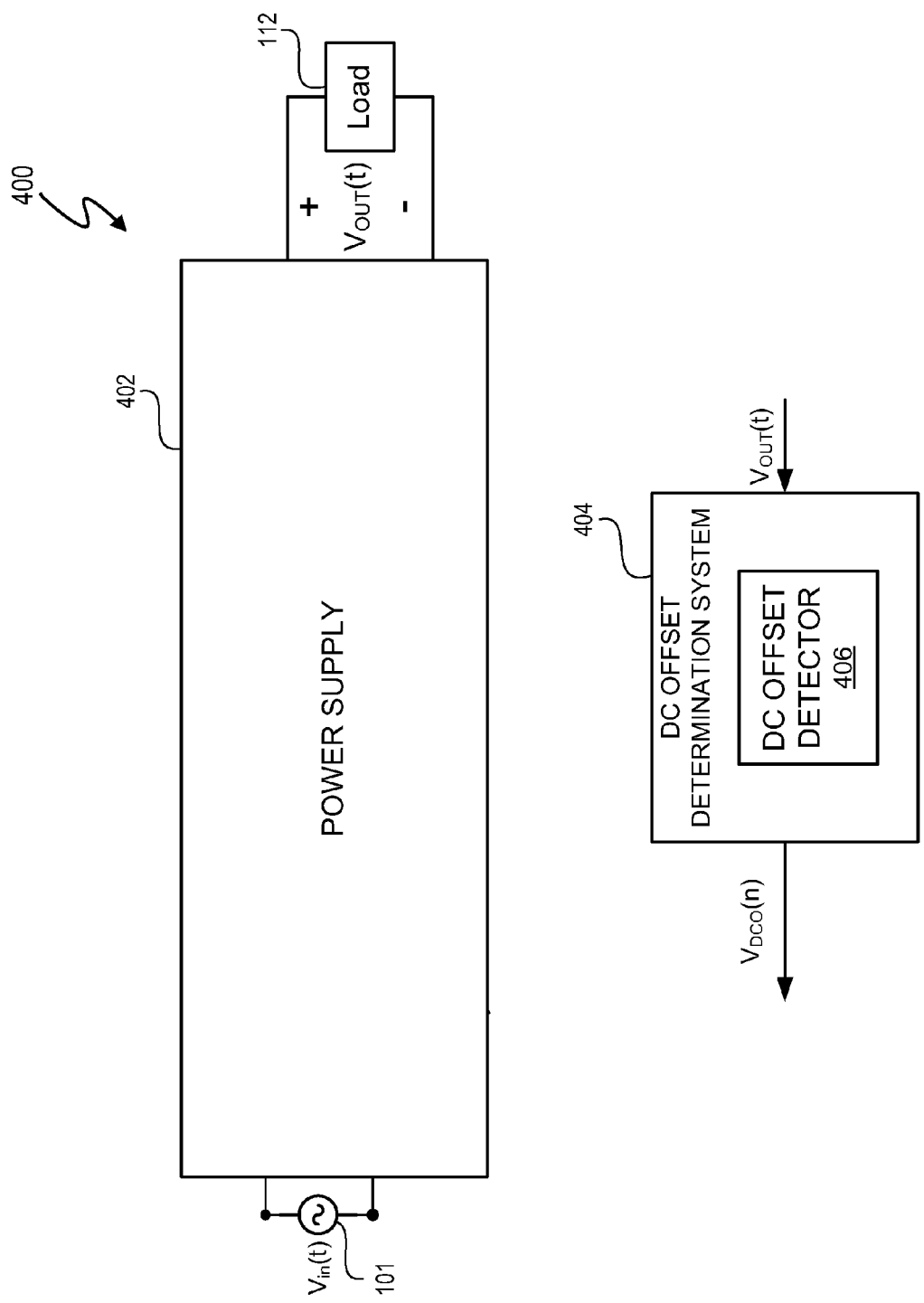
FIG. 4 depicts one embodiment of a power system that includes a power supply and a DC offset determination system with a DC offset detector.
Figure 6:
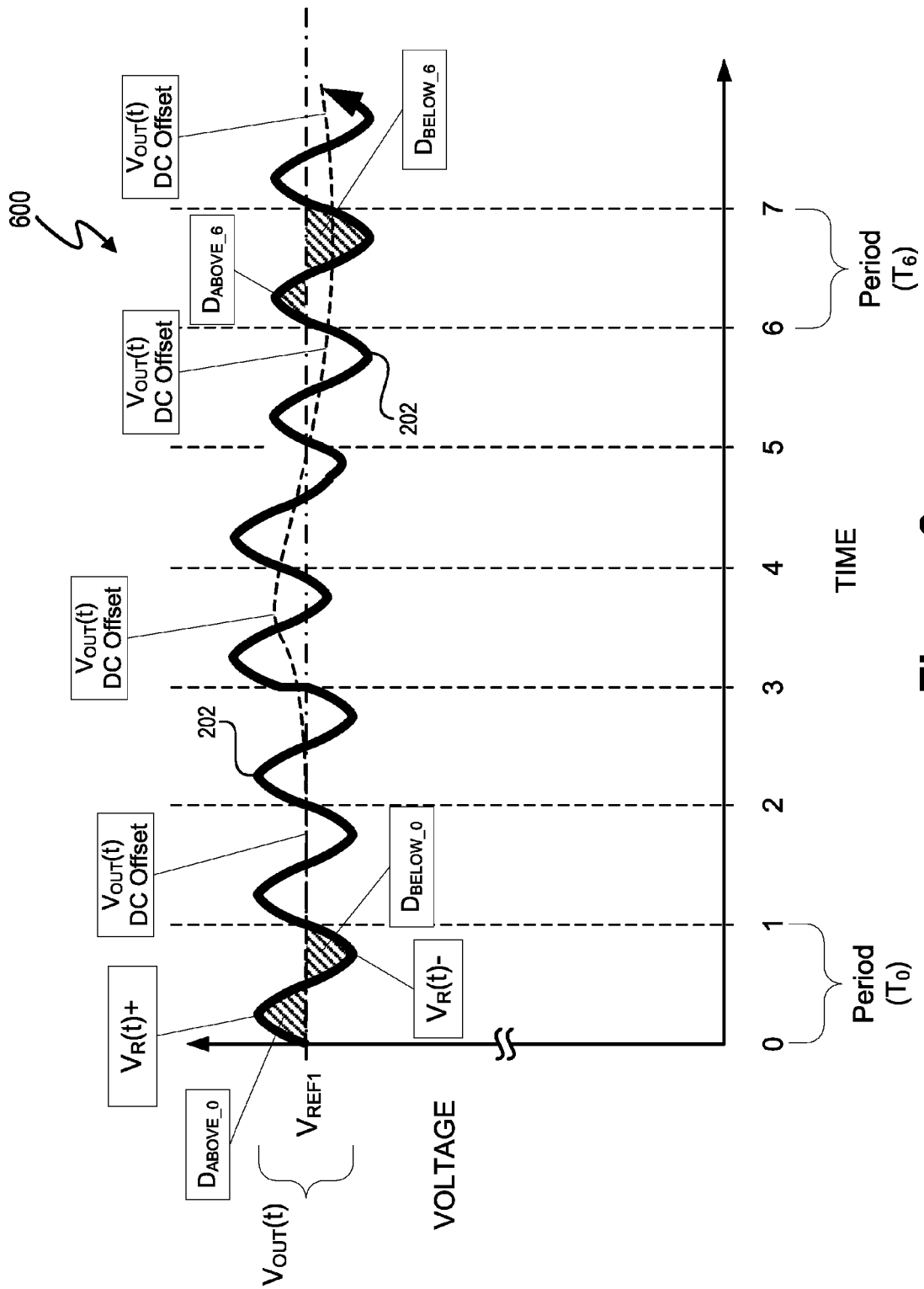
FIG. 6 depicts DC and ripple components of an output voltage feedback signal.

FIG. 4 depicts one embodiment of a power system 400 that includes a power supply 402 and a DC offset determination system 404 with a DC offset detector 406. The power supply 402 receives an AC input voltage $V_{in}(t)$ from voltage source 101 and supplies a power supply output voltage $V_{OUT}(t)$ to load 112. The power supply output voltage $V_{OUT}(t)$ includes a DC offset component and a ripple 202 (FIG. 6). The DC offset determination system 404 determines a discrete sampling signal $V_{DCO}(n)$, and the discrete sampling signal $V_{DCO}(n)$ represents a sample of a DC offset component of the power supply output voltage $V_{OUT}(t)$ substantially uninfluenced by ripple 202. "n" is a marker having a value that represents a particular sample. In at least one embodiment, the sampling frequency of the sampling signal $V_{DCO}(n)$ is the same as a frequency $f_R$ of ripple 202. In at least one embodiment, the ripple frequency $f_R$ equals twice the frequency of input voltage $V_{in}(t)$. Thus, in at least one embodiment, the DC offset determination system 404 samples the power supply output voltage $V_{OUT}(t)$ at twice the line frequency $f_L$ of input voltage $V_{in}(t)$ and substantially eliminates any effect of the ripple 202 on the sampling signal $V_{DCO}(n)$.

Figure 5:
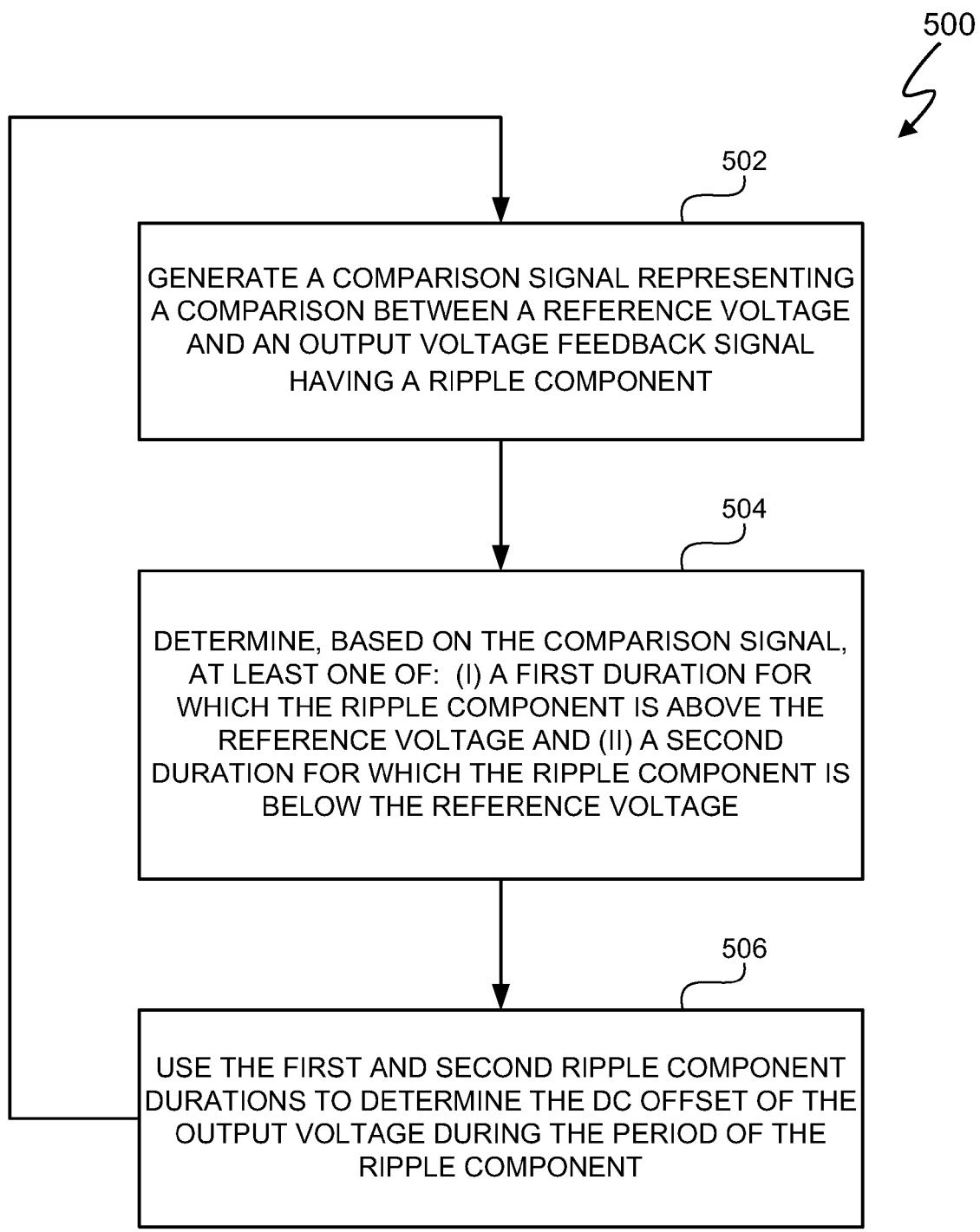
FIG. 5 depicts a DC offset determination process.
Figure 7:
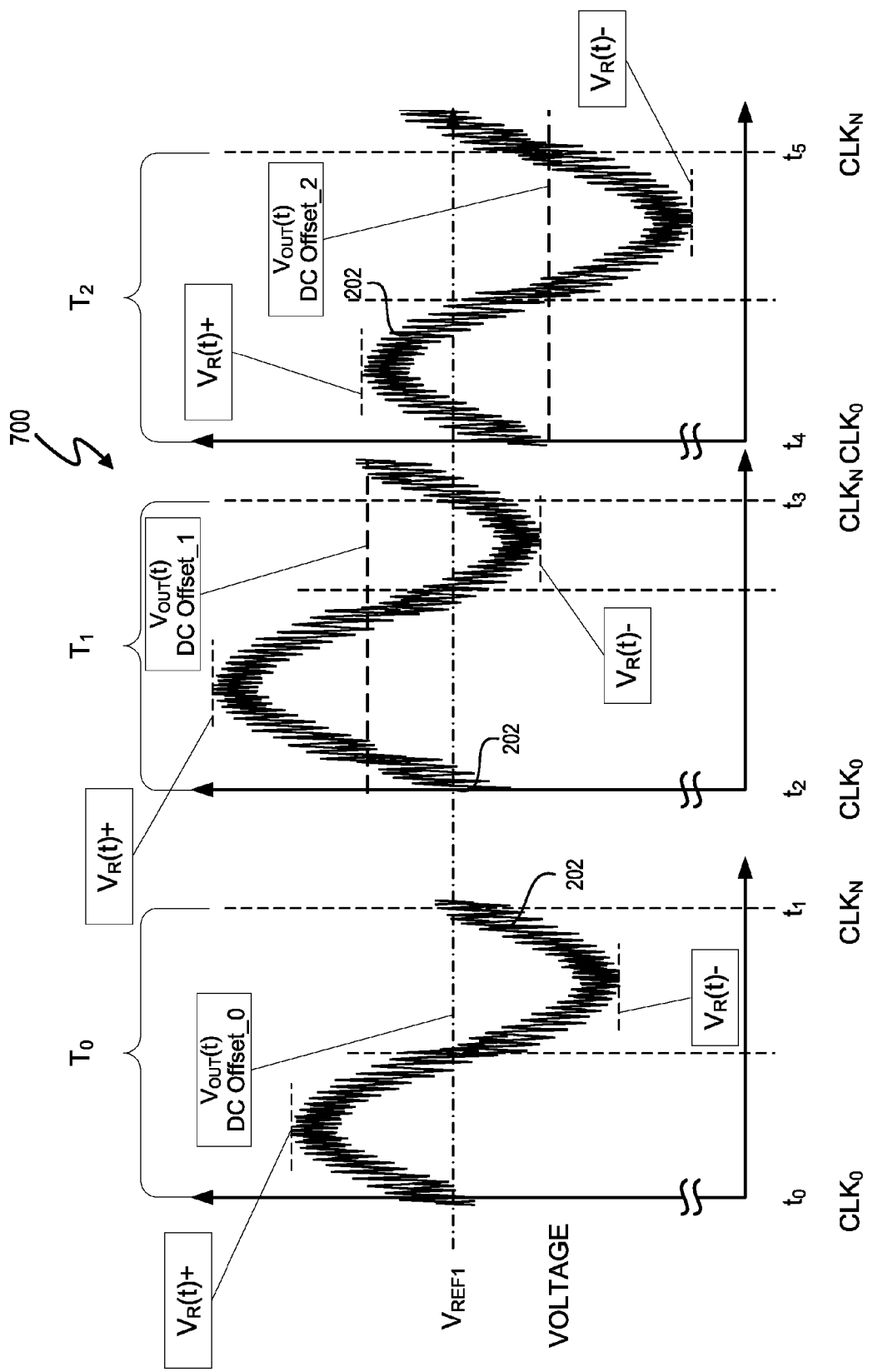
FIG. 7 depicts a voltage versus time graph that highlights three exemplary periods of a ripple component of a power supply output voltage signal.
Figure 8:
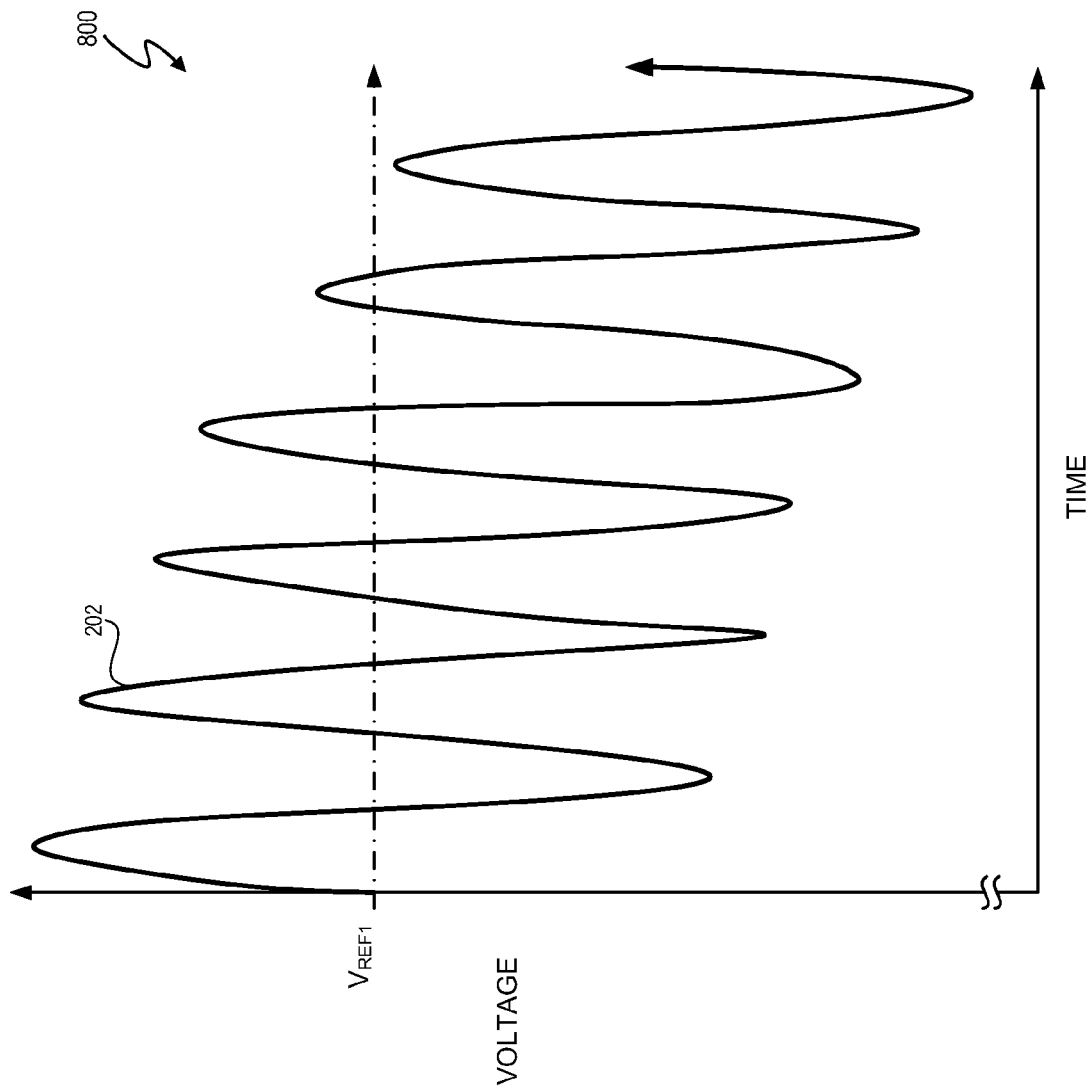
FIG. 8 depicts ripple components near a reference voltage.
Figure 9:
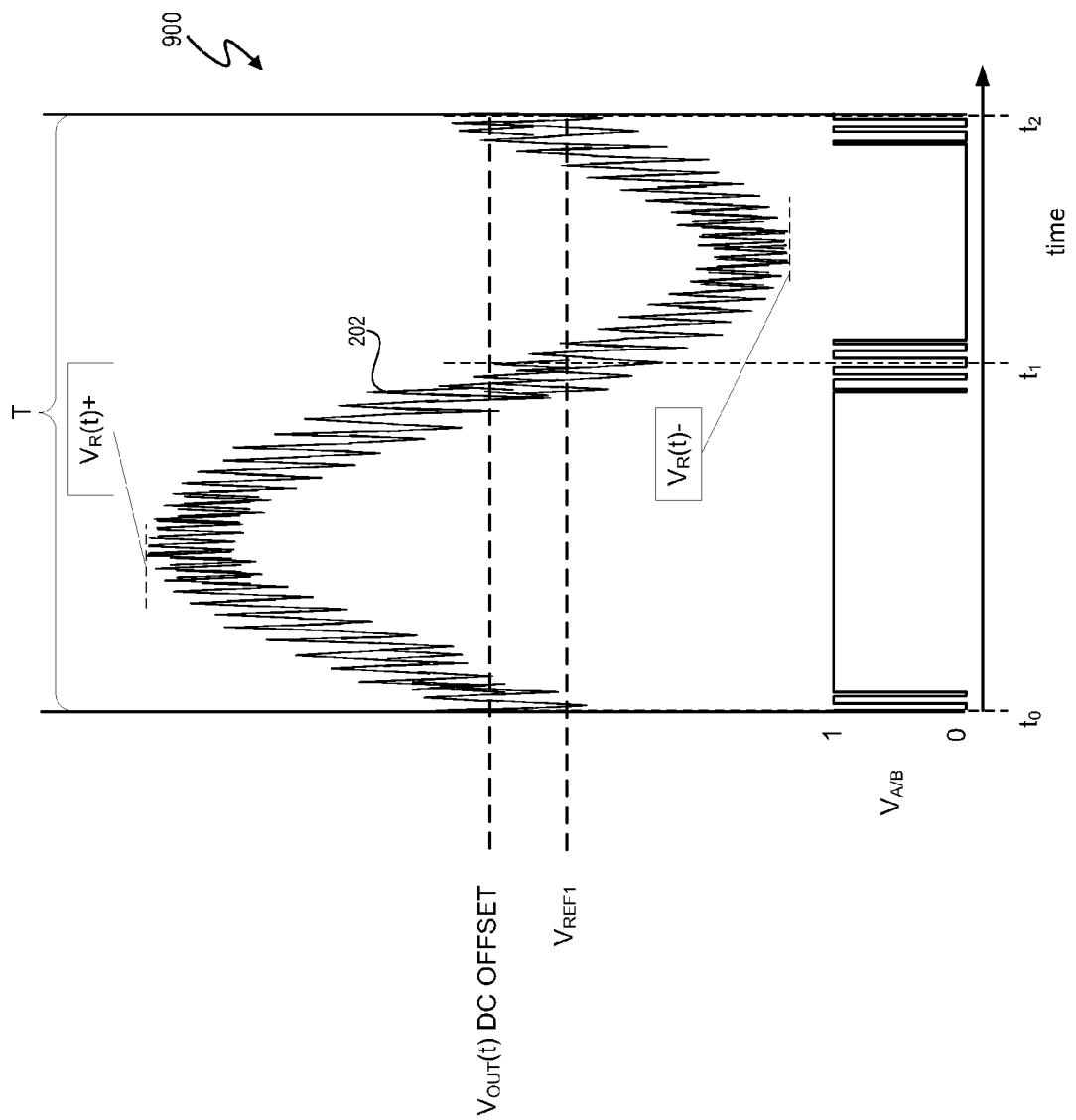
FIG. 9 depicts one exemplary period of a ripple component of a power supply output voltage signal and a corresponding comparison signal of a DC offset value calculator.
Figure 10:
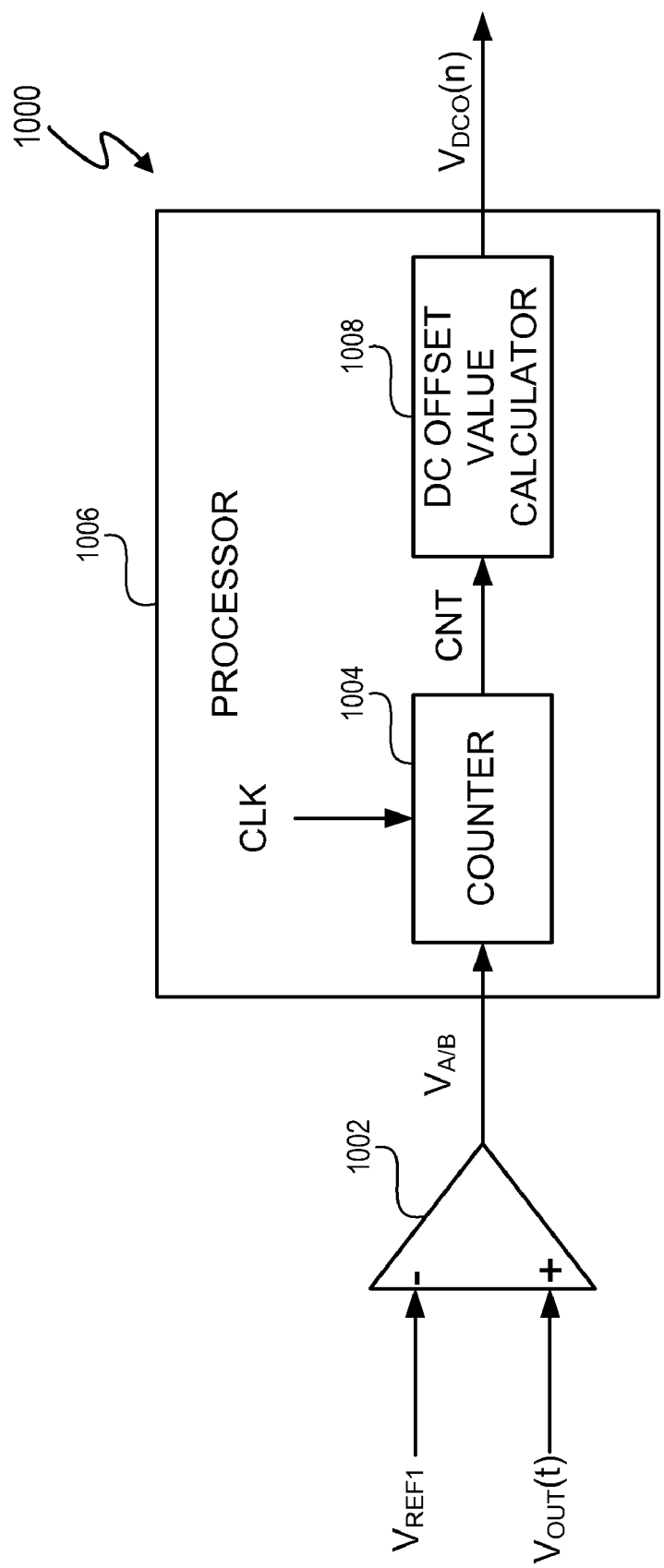
FIG. 10 depicts a DC offset determination system.
Figure 11:
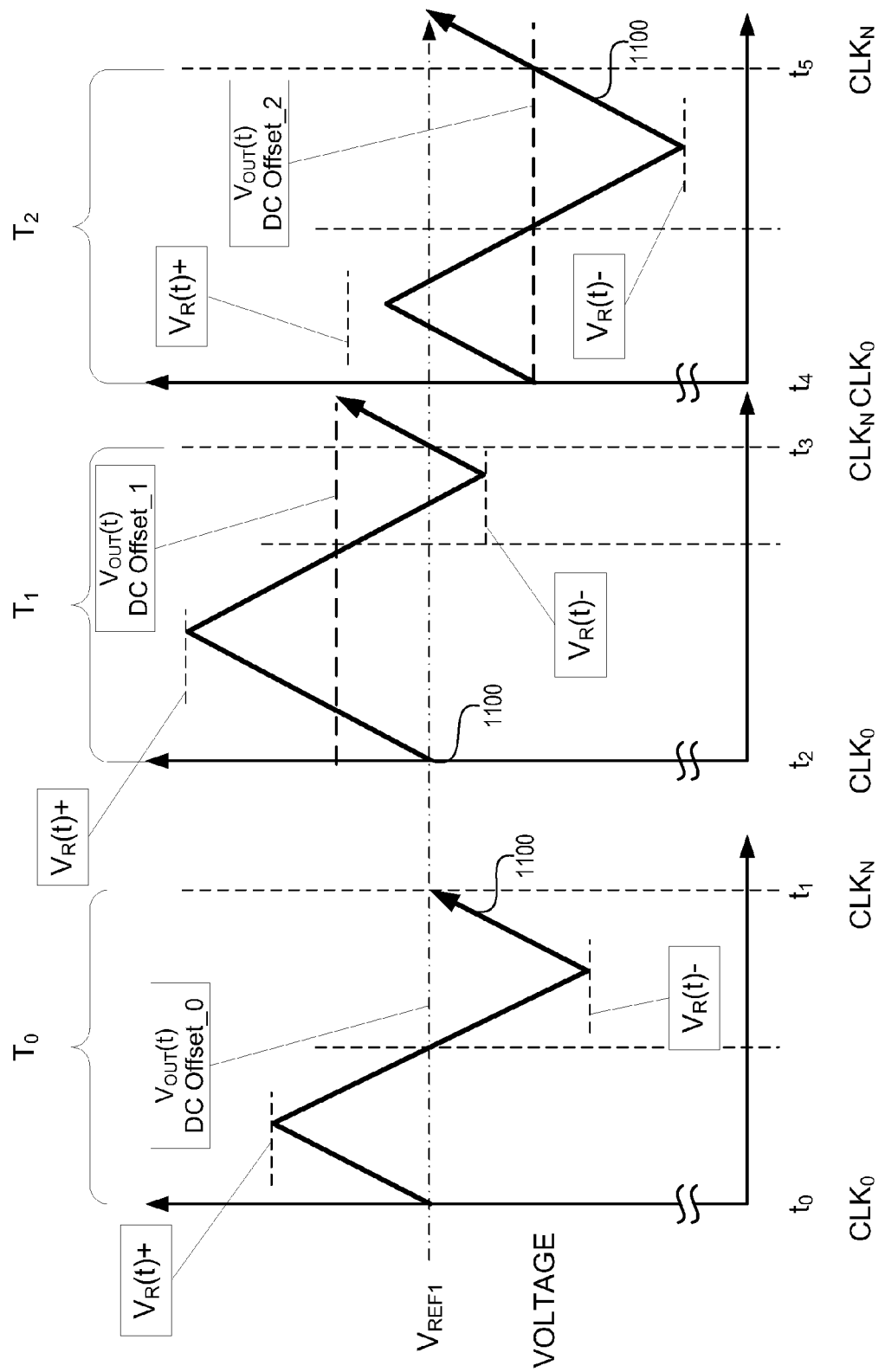
FIG. 11 depicts one embodiment of a triangular wave representing a linear approximation of a ripple component of a power supply output voltage signal.

FIGS. 4-11 depict embodiments of systems and processes of determining the sampling signal $V_{DCO}(n)$. FIG. 5 depicts a DC offset determination process 500. FIG. 6 depicts the DC and ripple components of one embodiment of the output voltage $V_{OUT}(t)$ together with a reference voltage $V_{REF1}$. FIG. 7 depicts a voltage versus time graph 700 that highlights three exemplary periods of ripple 202 in relation to the reference voltage $V_{REF1}$. FIG. 8 depicts exemplary ripple components 800 near the reference voltage $V_{REF1}$. FIG. 9 depicts one exemplary period 900 of ripple 202 and a corresponding comparison signal $V_{A/B}$. FIG. 10 depicts an exemplary DC offset determination system 1000 to physically implement process 500. FIG. 11 depicts one embodiment of triangular wave 1100, and the triangular wave 1100 represents a linear approximation of ripple 202.

Referring to FIGS. 4-11, in at least one embodiment, the DC offset determination system 404 determines the sampling signal $V_{DCO}(n)$ in accordance with DC offset determination process 500. Process 500 repeats for each period of ripple 202. For example, one period $T_0$ of ripple 202 is between time 0 and time 1 (FIG. 6). If ripple 202 is periodic, all periods of ripple 202 are equal. The DC offset determination process 500 uses a comparison between the output voltage $V_{OUT}(t)$ and the reference voltage $V_{REF1}$ to determine the DC offset of power supply output voltage signal $V_{OUT}(t)$. Determining the DC offset of output voltage $V_{OUT}(t)$ also determines the DC offset of power supply output voltage $V_{OUT}(t)$.

In operation 502, comparator 1002 generates a comparison signal $V_{A/B}$. Comparison signal $V_{A/B}$ represents a comparison between reference voltage $V_{REF1}$ and output voltage $V_{OUT}(t)$. Comparison signal $V_{A/B}$ changes states between logical "1" and a logical "0" based on an outcome of the comparison. The state changes of comparison signal $V_{A/B}$ indicate when the reference voltage $V_{REF1}$ equals the DC offset of output voltage $V_{OUT}(t)$, i.e. $V_{REF1}=V_{OUT}(t)$'DC offset. The state changes of comparison signal $V_{A/B}$ also indicate whether output voltage $V_{OUT}(t)$ is transitioning above or below the reference voltage $V_{REF1}$.

The reference voltage $V_{REF1}$ is set so that the value of the reference voltage $V_{REF1}$ is between the respective peaks $V_R(t)+$ and $V_R(t)-$ of ripple 202. The comparator 1002 generates a positive (logical 1) comparison signal $V_{A/B}$ when the output voltage $V_{OUT}(t)$ is above, i.e. greater than, the reference voltage $V_{REF1}$. The comparator 1002 generates a negative (logical 0) comparison signal $V_{A/B}$ when the output voltage $V_{OUT}(t)$ is below, i.e. less than, the reference voltage $V_{REF1}$. Thus, during a period of ripple 202, the state of comparison signal $V_{A/B}$ stays constant while the ripple 202 is above the reference voltage $V_{REF1}$ and changes state when the ripple 202 transitions below the reference voltage $V_{REF1}$. The respective peaks $V_R(t)+$ and $V_R(t)-$ of ripple 202 can be predetermined or measured by DC offset determination system 404 by determining the voltage fluctuation range of $V_{OUT}(t)$ under a constant load 112.

In operation 504, processor 1006 receives the comparison signal $V_{A/B}$ and determines, based on the comparison signal, at least one of: (i) a first duration for which the ripple component is above the reference voltage $V_{REF1}$ and (ii) a second duration for which the ripple component is below the reference voltage $V_{REF1}$. In FIG. 6, the durations above the reference voltage $V_{REF1}$ for periods $T_0$ and $T_6$ of ripple 202 have been respectively labeled "$D_{ABOVE\_0}$" and "$D_{ABOVE\_6}$", and the durations below the reference voltage $V_{REF1}$ for periods $T_0$ and $T_6$ have been respectively labeled "$D_{BELOW\_0}$" and "$D_{BELOW\_6}$" in FIG. 6. The other periods of ripple 202 also have durations above and durations below the reference voltage $V_{REF1}$ but are not specifically labeled to avoid obfuscating features in FIG. 6.

Graph 600 of FIG. 6 depicts the power supply output voltage $V_{OUT}(t)$ increasing between times 2 and 3, decreasing between times 3 and 6, and increasing between times 6 and 7. Accordingly, the DC offset of power supply output voltage $V_{OUT}(t)$ ($V_{OUT}(t)$ DC offset) and the peak-to-peak ripple voltages $V_R(t)+$ and $V_R(t)-$ also increase and decrease in unison. Thus, the relationship between ripple 202 and the reference voltage $V_{REF1}$ changes as the power supply output voltage $V_{OUT}(t)$ changes over time.

The voltage versus time graph 700 (FIG. 7) highlights three exemplary periods $T_0$, $T_1$, and $T_2$ of ripple 202 in relation to the reference voltage $V_{REF1}$. In at least one embodiment, the reference voltage $V_{REF1}$ remains constant for an interval of time. In at least one embodiment, the reference voltage $V_{REF1}$ remains constant during the operation of power control system 400. In at least one embodiment, the reference voltage $V_{REF1}$ increases if the duration of the output voltage $V_{OUT}(t)$ equals the period of ripple 202 and decreases if the duration of the output voltage $V_{OUT}(t)$ equals the period of ripple 202. As the DC offset of output voltage $V_{OUT}(t)$ changes, the relationship between the reference voltage $V_{REF1}$ and the output voltage $V_{OUT}(t)$ changes. The processor 1006 can take any of a variety of actions if the ripple 202 increases completely above or decreases completely below the reference voltage $V_{REF1}$. For example, the processor 1006 can change the reference voltage $V_{REF1}$ in the direction of ripple 202 as indicated by the comparison signal $V_{A/B}$ indication, i.e. higher if the comparison signal $V_{A/B}$ is logical "1" and lower if the comparison signal $V_{A/B}$ is logical "0". In another embodiment, the power supply 402 modifies the output voltage $V_{OUT}(t)$ until processor 1006 indicates that the reference voltage $V_{REF1}$ is within the peak-to-peak voltages $V_R(t)+$ to $V_R(t)-$.

For example, during period $T_0$, the duration of ripple 202 above the reference voltage $V_{REF1}$ is equal to the duration below the reference voltage $V_{REF1}$. Thus, for period $T_0$, the reference voltage $V_{REF1}$ equals the DC offset of output voltage $V_{OUT}(t)$. During period $T_1$, the duration of ripple 202 above the reference voltage $V_{REF1}$ is greater than the duration below the reference voltage $V_{REF1}$. Thus, for period $T_1$, the reference voltage $V_{REF1}$ is less than DC offset of output voltage $V_{OUT}(t)$. During period $T_2$, the duration of ripple 202 above the reference voltage $V_{REF1}$ is less than the duration below the reference voltage $V_{REF1}$. Thus, for period $T_2$, the reference voltage $V_{REF1}$ is greater than DC voltage $V_{OUT}(t)$ DC offset. As discussed subsequently in more detail, determining the difference between the reference voltage $V_{REF1}$ and DC offset for voltage $V_{OUT}(t)$ allows DC offset determination system 404 to determine the DC offset for voltage $V_{OUT}(t)$ and, thus, sample output voltage $V_{OUT}(t)$ approximately uninfluenced by ripple 202.

FIG. 8 depicts exemplary waveform components 800 of ripple 202 near the reference voltage $V_{REF1}$. The waveform components 800 depict exemplary perturbations in ripple 202. The comparison signal $V_{A/B}$ is a Near reference voltage $V_{REF1}$, ripple 202 crosses the reference voltage $V_{REF1}$ multiple times.

FIG. 9 depicts one exemplary period of ripple 202 and a corresponding comparison signal $V_{A/B}$. The comparison signal $V_{A/B}$ changes states each time the ripple 202 crosses the reference voltage $V_{REF1}$. Because of the noise on the ripple 202, as indicated by the exemplary waveform components 800 (FIG. 8), when the ripple 202 is near the reference voltage $V_{REF1}$, the ripple 202 crosses the reference voltage frequently. In at least one embodiment, the comparison signal $V_{A/B}$ crosses the reference voltage $V_{A/B}$ at the beginning of ripple 202 at and around time $t_0$, at and around time $t_1$, and at the end of ripple 202 at and around time $t_2$. Each time the ripple 202 crosses the reference voltage $V_{REF1}$, the comparison signal $V_{A/B}$ changes logical states.

In at least one embodiment and as described subsequently in more detail, if the period of ripple 202 is known or estimated, then the DC offset value calculator 1008 can determine the DC offset of output voltage $V_{OUT}(t)$ using either the duration of ripple 202 above the reference voltage $V_{REF1}$, the duration of ripple 202 below the reference voltage $V_{REF1}$, or both. In at least one embodiment, the ripple 202 frequency $f_R$ equals twice the frequency $f_L$ of input voltage $V_{in}(t)$. Thus, if the frequency of input voltage $V_{in}(t)$ equals 60 Hz, the ripple frequency $f_R$ equals 120 Hz. In at least one embodiment, if the period of ripple 202 is unknown or not estimated, then DC offset value calculator 1008 determines both the duration of ripple 202 above the reference voltage $V_{REF1}$ and the duration of ripple 202 below the reference voltage $V_{REF1}$, and, then determines the DC offset of output voltage $V_{OUT}(t)$.

In at least one embodiment, operation 504 utilizes DC offset determination system 1000 to determine the duration of ripple 202 above the reference voltage $V_{REF1}$ during a period of ripple 202. The DC offset determination system 1000 of FIG. 10 represents one embodiment of the DC offset determination system 404 of FIG. 4. In at least one embodiment, counter 1004 determines a number of clock cycles of clock signal CLK that occur while the comparison signal $V_{A/B}$ is logical "1", indicating that ripple 202 is above the reference voltage $V_{REF1}$. Counter 1004 generates count signal CNT that, in at least one embodiment, represents the number of cycles that ripple 202 is above the reference voltage $V_{REF1}$, and, thus, represents the duration of ripple 202 above the reference voltage $V_{REF1}$.

In at least one embodiment, operation 504 utilizes DC offset determination system 1000 to determine the duration of ripple 202 below the reference voltage $V_{REF1}$ during a period of ripple 202. In at least one embodiment, counter 1004 determines a number of clock cycles of clock signal CLK that occur while the comparison signal $V_{A/B}$ is logical "0", indicating that ripple 202 is below the reference voltage $V_{REF1}$. Counter 1004 generates a count signal CNT that, in at least one embodiment, represents the number of cycles that ripple 202 is below the reference voltage $V_{REF1}$, and, thus, represents the duration of ripple 202 below the reference voltage $V_{REF1}$.

In at least one embodiment, operation 504 utilizes the DC offset determination system 1000 to determine both the duration of ripple 202 above and below the reference voltage $V_{REF1}$. In this embodiment, the count signal CNT represents both the number of cycles the ripple 202 is above and below the reference voltage $V_{REF1}$. In this embodiment, count signal CNT can be 2 separate signals, one representing the number of cycles the ripple 202 is above the reference voltage $V_{REF1}$ and one representing the number of cycles below the reference voltage $V_{REF1}$.

The clock frequency $f_{CLK}$ is set higher than the frequency of ripple 202. The particular clock frequency $f_{CLK}$ is a matter of design choice and is, for example, set between 20 kHz and 150 kHz. The higher the clock frequency $f_{CLK}$, the more accurate the determination of the fraction of time that ripple 202 exceeds the reference voltage $V_{REF1}$. Setting the clock frequency $f_{CLK}$ higher than the highest frequency of exemplary ripple components 800 allows counter 1004 to accurately count the duration of ripple 202 near the reference voltage $V_{REF1}$.

Thus, in summary, in at least one embodiment of operation 504, the DC offset determination system 1000 counts the number of clock cycles during which the ripple 202 is above, below, or both above and below the reference voltage $V_{REF1}$. In at least one embodiment, the ripple 202 crosses the voltage reference $V_{REF1}$ multiple times during a period of ripple 200, and, in at least one embodiment, the counter 1004 counts all the cycles of clock signal CLK during which the comparison signal $V_{A/B}$ is a logical "1" to determine the time ripple 202 is above the reference voltage $V_{REF1}$. In at least one embodiment, the counter 1004 counts all the cycles of clock signal CLK during which the comparison signal $V_{A/B}$ is logical "0" to determine the time ripple 202 is below the reference voltage $V_{REF1}$.

FIG. 11 depicts one embodiment of triangular wave 1100, and the triangular wave 1100 represents a linear approximation of ripple 202 corresponding to the three periods of ripple 202 depicted in a voltage versus time graph 700. Triangular wave 1100 has peak-to-peak voltages of $V_R(t)+$ to $V_R(t)-$. By approximating ripple 202 as a triangular wave, DC offset value calculator 1008 can relatively easily and quickly determine the DC offset of power supply output voltage $V_{OUT}(t)$. Using a linear approximation of the ripple 202, such as a triangular wave approximation, can simplify the implementation of DC offset value calculator 1008 without significantly compromising accuracy.

In at least one embodiment, in operation 506, DC offset value calculator 1008 determines the fraction of the ripple 202 above the reference voltage $V_{REF1}$ using a linear approximation of ripple 202. In one embodiment, DC offset calculator 1008 uses the triangular wave 1100 approximation of ripple 202 to determine an approximate DC offset voltage $V_{OUT}(t)'$ in accordance with Equation [1]:

$$DC \text{ Offset } V_{OUT}(t) \cong V_{REF1} + V_R(t)^+ \cdot (2D-1) \quad \text{Equation [1]}.$$

DC Offset $V_{OUT}(t)'$ represents the DC offset of output voltage $V_{OUT}(t)$. "$V_{REF}$" represents the reference voltage against which the ripple 202 is compared. "$V_R(t)+$" represents the highest peak voltage of ripple 202. "D" represents the fraction of time that ripple 202 is above the reference voltage during a period of rippled 202, i.e. D=(duration of ripple 202 above the reference voltage $V_{REF1}$)/(period of ripple 202). The period of ripple 202 can be predetermined or can be determined by adding the above and below durations of ripple 202 with respect to the reference voltage $V_{REF1}$. In at least one embodiment, if the period 202 is known, the duration of ripple 202 below the reference voltage $V_{REF1}$ does not need to be explicitly determined in operation 504. However, whether the period is known or unknown, both the duration of ripple 202 above and below the reference voltage $V_{REF1}$ are used to determine the DC offset of output voltage $V_{OUT}(t)$ because the period of ripple 202 includes both the durations of ripple 202 above and below the reference voltage $V_{REF1}$.

In an example operation 506, if the clock frequency $f_{CLK}$=48 kHz, the ripple frequency $f_R$=120 Hz, the number of cycles of clock signal CLK is 400 cycles/period. If the duration of ripple 202 above the reference voltage $V_{REF1}$ is 300 cycles, the duration of ripple 202 below the reference voltage $V_{REF1}$ is 100 cycles, and the ripple peak voltage $V_R(t)+$=2V, and the reference voltage $V_{REF1}$=400 V then:

$$DC \text{ Offset } V_{OUT}(t) = 400 + 2 \cdot ((2 \cdot (300/400)) - 1) = 401 \text{ V}.$$

In at least one embodiment, the power supply output voltage $V_{OUT}(t)$ is represented by an associated output voltage signal $V_{OUT}(t)'$. The $V_{OUT}(t)'$ represents the power supply output voltage $V_{OUT}(t)$ in a version amenable for determining the DC offset of the power supply output voltage. In at least one embodiment, the output voltage signal $V_{OUT}(t)'$ is a direct representation of the power supply output voltage $V_{OUT}(t)$, and, in at least one embodiment, the output voltage signal is derived from the power supply output voltage. For example, in at least one embodiment, the output voltage signal is scaled using, for example, a voltage divider or a variable current source as described in Melanson I and Melanson II. In at least one embodiment, the output voltage signal is scaled to a voltage that can be safely received by an integrated circuit.

The output voltage signal $V_{OUT}(t)'$ can be used in place of the output voltage $V_{OUT}(t)$ to determine the DC offset of the output voltage $V_{OUT}(t)$ in Equation [1]. Accordingly, determining the DC offset of the output voltage signal $V_{OUT}(t)'$ determines the DC offset of power supply output voltage $V_{OUT}(t)$. By determining the approximate DC offset $V_{OUT}(t)'$, the contribution of ripple 202 to the power supply output voltage $V_{OUT}(t)$ is effectively removed.

Equation [1] represents an exemplary process for calculating an estimated DC offset voltage $V_{OUT}(t)'$. Many other processes can be used to estimate the DC offset voltage $V_{OUT}(t)$. Equation [1] can be modified to use the fraction of time ripple 202 that is below the reference voltage $V_{REF}$. Equation [1] can be modified to accommodate different approximations of ripple 202, such as a more complex nonlinear estimation of ripple 202. Areas of the ripple 202 above and/or below the reference voltage $V_{REF}$ can also be used, and Equation [1] modified accordingly.

The DC offset value calculator 1008 provides the sampling signal $V_{DCO}(n)$, which represents the DC offset of power supply output voltage $V_{OUT}(t)$. Each value of sampling signal $V_{DCO}(n)$, thus, represents a sample of power supply output voltage $V_{OUT}(t)$ with a sampling rate equal to the ripple frequency $f_R$. Each value of sampling signal $V_{DCO}(n)$ is substantially uninfluenced by ripple 202 and is sufficient for many applications, such as power factor correction and output voltage regulation controllers.

Referring to FIG. 4, the sampling signal $V_{DCO}(n)$ represents the DC offset of the power supply output voltage $V_{OUT}(t)$. The sampling signal $V_{DCO}(n)$ can be used for any of a variety of purposes. For example, the sampling signal $V_{DCO}(n)$ can be used as an input to display the DC component of the power supply output voltage $V_{OUT}(t)$. In another embodiment, the sampling signal $V_{DCO}(n)$ can be used as feedback to a control system, and the control system controls one or more aspects (such as power factor correction and output voltage regulation) of the power supply 402.

Figure 12:
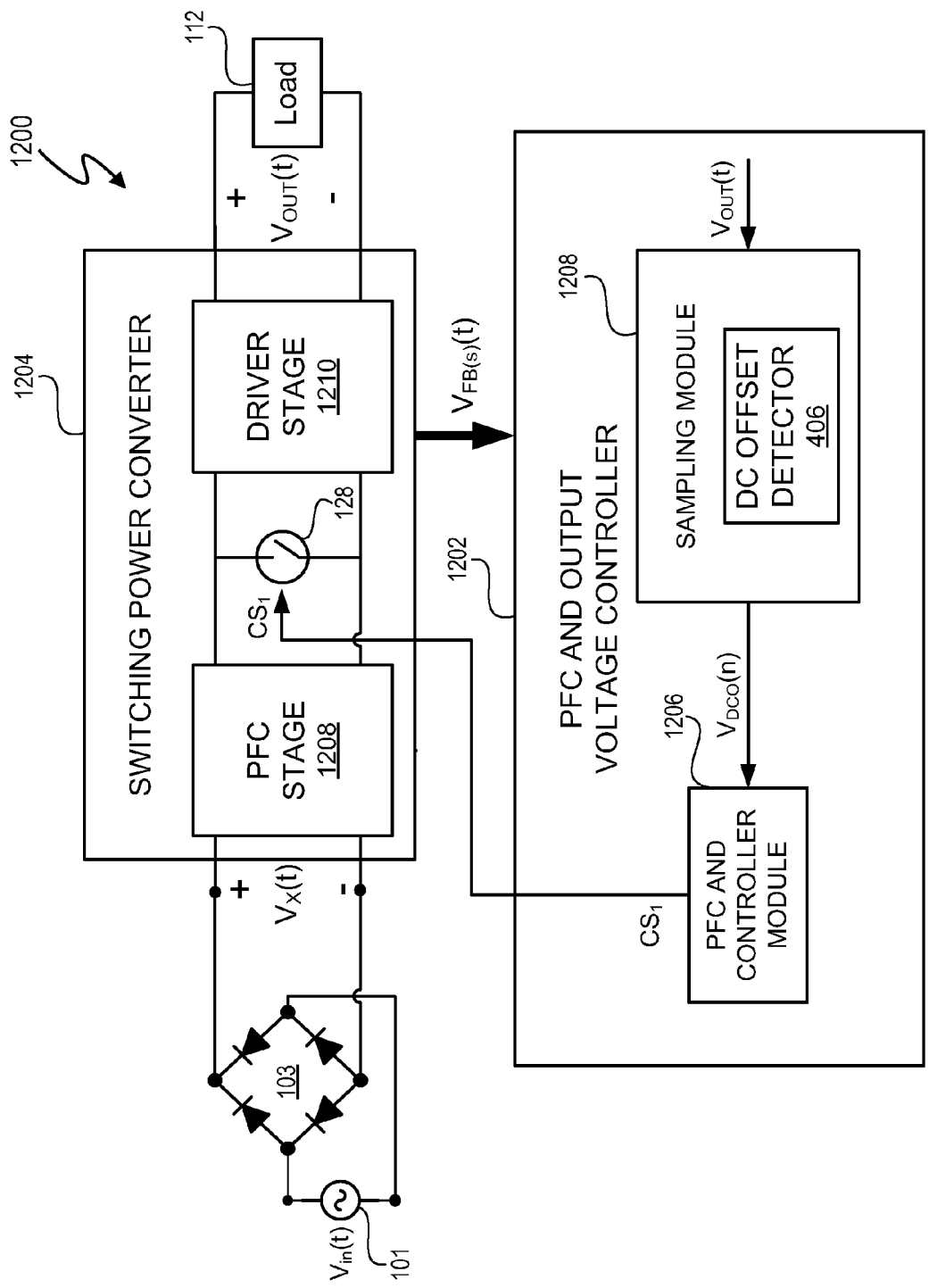
FIG. 12 depicts a power control system having a sampling module with a DC offset detector.

FIG. 12 depicts a power control system 1200 that includes a PFC and output voltage controller 1202 to provide a power factor correction (PFC) and output voltage regulation control signal to switch 128 of switching power converter 1204. The switching power converter 1204 includes a PFC stage 1208 and a driver stage 1210. The particular configuration of PFC stage 1208 and driver stage 1210 is a design choice. In at least one embodiment, PFC stage 124 represents one embodiment of PFC stage 1208, and driver stage 126 represents one embodiment of driver stage 1210. As, for example, described in Melanson I and Melanson II, control signal $CS_1$ controls conduction of switch 108, and the period and duty cycle of control signal $CS_1$ controls power factor correction and output voltage regulation of switching power converter 1204.

The PFC and output voltage controller 1202 includes a PFC and controller module 1206 to determine control signal $CS_1$. As, for example, described in Melanson I and Melanson II, the determination of control signal $CS_1$ is based on feedback data $V_{FB(s)}$ representing the input voltage $V_x(t)$ and the power supply output voltage $V_{OUT}(t)$. The sampling module 1208 represents one embodiment of DC offset determination system 404. The sampling module 1208 provides the sampling signal $V_{DCO}(n)$ at a rate equal to the ripple frequency $f_R$. Thus, in at least one embodiment, the PFC and output voltage controller 1206 can respond to changes in the power supply output voltage $V_{OUT}(t)$ within $1/f_R$ seconds.

Accordingly, a DC offset determination system can determine a DC offset of a power supply voltage and, thus, for example, sample a power supply output voltage using a comparison of the ripple component of the output voltage to a reference voltage. In at least one embodiment, the sampled output voltage has a sampling frequency equal to 1/(the ripple frequency $f_R$) and is substantially uninfluenced by the ripple component.

Although the present invention has been described in detail, it should be understood that various changes, substitutions and alterations can be made hereto without departing from the spirit and scope of the invention as defined by the appended claims.

What is claimed is:

1. An apparatus comprising a power supply output voltage direct current (DC) offset detector, wherein an output voltage of a power supply comprises a ripple component and a DC offset, wherein the power supply output voltage DC offset detector comprises:
   a comparator to generate a comparison signal during a period of the ripple component, wherein the comparison signal represents a comparison between the ripple component and a reference voltage; and
   a processor, coupled to the comparator, configured to:
      determine, based on the comparison signal, at least one of: (i) a first duration for which the ripple component is above the reference voltage and (ii) a second duration for which the ripple component is below the reference voltage; and
      use the first and second ripple component durations to determine the DC offset of the output voltage during the period of the ripple component.

2. The apparatus of claim 1 wherein the processor is further configured to determine, based on the comparison signal, both the first duration for which the ripple component is above the reference voltage and the second duration for which the ripple component is below the reference voltage.

3. The apparatus of claim 1 wherein the processor comprises a counter to determine the first and second durations.

4. The apparatus of claim 3 wherein the counter is configured to:
   count a number of cycles, during the ripple period, that the ripple component is above the reference voltage, wherein the number of cycles represents the duration for which the ripple component is above the reference voltage.

5. The apparatus of claim 1 further comprising:
   a power factor correction and output voltage controller coupled to the processor.

6. The apparatus of claim 5 further comprising:
   a switching power converter coupled to the power factor correction and output voltage controller.

7. The apparatus of claim 1 wherein the processor is further configured to:
   use the reference voltage and a peak voltage of the ripple component to determine the DC offset of the output voltage.

8. The apparatus of claim 7 wherein the processor is further configured to determine the DC offset of the output voltage in accordance with:

DC Offset $V_{OUT}(t) \cong V_{REF1} + V_R(t)^+ \cdot (2D-1)$;

wherein the DC Offset $V_{OUT}(t)$ represents the DC offset of the output voltage, "$V_{REF1}$" represents the reference voltage, "$V_R(t)+$" represents a highest peak voltage of the ripple component during the period of the ripple component, and "D" represents (the first duration)/(the first duration+the second duration).

9. The apparatus of claim 1 wherein the processor is further configured to determine the DC offset of the output voltage based upon a linear approximation of ripple component.

10. The apparatus of claim 1 wherein the DC offset of the output voltage represents a sample of the output voltage of the power supply having a sample rate equal to a frequency of the ripple component.

11. A method to determine a direct current (DC) offset of an output voltage of a power supply, wherein the output voltage comprises a periodic ripple component and a DC offset, the method comprising:
   generating a comparison signal during a period of the ripple component, wherein the comparison signal represents a comparison between the ripple component and a reference voltage;
   determining, based on the comparison signal, at least one of: (i) a first duration for which the ripple component is above the reference voltage and (ii) a second duration for which the ripple component is below the reference voltage; and
   using the first and second ripple component durations to determine the DC offset of the output voltage during the period of the ripple component.

12. The method of claim 11 wherein determining, based on the comparison signal, at least one of: (i) a first duration for which the ripple component is above the reference voltage and (ii) a second duration for which the ripple component is below the reference voltage comprises:
   determining, based on the comparison signal, both the first duration for which the ripple component is above the reference voltage and the second duration for which the ripple component is below the reference voltage.

13. The method of claim 11 wherein determining, based on the comparison signal, at least one of: (i) a first duration for which the ripple component is above the reference voltage and (ii) a second duration for which the ripple component is below the reference voltage comprises:
   counting a number of cycles, during the ripple period, that the ripple component is above the reference voltage, wherein the number of cycles represents the duration for which the ripple component is above the reference voltage.

14. The method of claim 11 further comprising:
   using the DC offset of the output voltage to generate a power factor correction and output voltage control signal.

15. The method of claim 14 further comprising:
   providing the control signal to a switching power converter.

16. The method of claim 11 further comprising:
   using the first and second durations, the reference voltage, and a peak voltage of the ripple component to determine the DC offset of the output voltage.

17. The method of claim 11 wherein using the first and second durations to determine the DC offset of the output voltage comprises determining the DC offset of the output voltage in accordance with:

DC Offset $V_{OUT}(t) \cong V_{REF1} + V_R(t)^+ \cdot (2D-1)$;

wherein the DC Offset $V_{OUT}(t)$ represents the DC offset of the output voltage, "$V_{REF1}$" represents the reference voltage, "$V_R(t)+$" represents a highest peak voltage of the ripple component during the period of the ripple component, and "D" represents (the first duration)/(the first duration+the second duration).

18. The method of claim 11 wherein
   the DC offset of the output voltage represents a sample of the output voltage of the power supply having a sample rate equal to a frequency of the ripple component.

19. A sampling module to sample a power supply output voltage, wherein the power supply output voltage comprises a ripple component and a DC offset, wherein the sampling module comprises:
- a comparator to generate a comparison signal during a period of the ripple component, wherein the comparison signal represents a comparison between the ripple component and a reference voltage; and
- a processor, coupled to the comparator, configured to:
  - determine, based on the comparison signal, a duration for which the ripple component is above the reference voltage; and
  - use the duration for which the ripple component is above the reference voltage and use the period of the ripple component to determine a sample of the output voltage during the period of the ripple component.

20. A sampling module to sample a power supply output voltage, wherein the power supply output voltage comprises a ripple component and a DC offset, wherein the sampling module comprises:
- a comparator to generate a comparison signal during a period of the ripple component, wherein the comparison signal represents a comparison between the ripple component and a reference voltage; and
- a processor, coupled to the comparator, configured to:
  - determine, based on the comparison signal, a duration for which the ripple component is below the reference voltage; and
  - use the duration for which the ripple component is below the reference voltage and use the period of the ripple component to determine a sample of the output voltage during the period of the ripple component.

* * * * *